(12) United States Patent
Park et al.

(10) Patent No.: US 7,259,978 B2
(45) Date of Patent: Aug. 21, 2007

(54) SEMICONDUCTOR MEMORY DEVICES AND SIGNAL LINE ARRANGEMENTS AND RELATED METHODS

(75) Inventors: Chul-Woo Park, Gyeonggi-do (KR); Jung-Bae Lee, Gyeonggi-do (KR); Young-Sun Min, Seoul (KR); Jong-Hyun Choi, Gyeonggi-do (KR); Jong-Eon Lee, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/221,684

(22) Filed: Sep. 8, 2005

(65) Prior Publication Data

US 2006/0056218 A1    Mar. 16, 2006

(30) Foreign Application Priority Data

Sep. 10, 2004    (KR) ...................... 10-2004-0072762

(51) Int. Cl.
*G11C 5/06*    (2006.01)
(52) U.S. Cl. ................... 365/63; 365/149; 365/230.03; 365/230.06
(58) Field of Classification Search .................. 365/63, 365/149, 230.03, 230.06
See application file for complete search history.

(56) References Cited

U.S. PATENT DOCUMENTS

| | | | |
|---|---|---|---|
| 5,877,981 A | 3/1999 | Iwahashi | |
| 6,037,621 A | 3/2000 | Wilson | |
| 6,046,775 A | 4/2000 | Jonnalagadda et al. | |
| 6,252,898 B1 | 6/2001 | Eto et al. | |
| 6,278,628 B1 * | 8/2001 | Sekiguchi et al. | ............ 365/63 |
| 6,282,147 B1 * | 8/2001 | Fujima | .................. 365/230.06 |

FOREIGN PATENT DOCUMENTS

JP    04-324190    11/1992

\* cited by examiner

*Primary Examiner*—Hoai V. Ho
(74) *Attorney, Agent, or Firm*—Myers Bigel Sibley & Sajovec

(57) ABSTRACT

A semiconductor memory device may include a memory cell array, a bit line sense amplifier, a sub word line driver, and an electrode. The memory cell array may include a sub memory cell array connected between sub word lines and bit line pairs and having memory cells which are selected in response to a signal transmitted to the sub word lines and column selecting signal lines. The bit line sense amplifier may be configures to sense and amplify data of the bit line pairs. The sub word line driver may be configured to combine signals transmitted from word selecting signal lines and signals transmitted from main word lines to select the sub word lines. Moreover, the memory cell array may be configured to transmit data between the bit line pairs and local data line pairs and to transmit data between the local data line pairs and global data line pairs. The electrode may be configured to cover the whole memory cell array and to apply a voltage needed for the memory cells. The local data line pairs may be arranged on a first layer above the electrode in the same direction as the sub word line. The column selecting signal lines and the global data line pairs may be arranged on a second layer above the electrode in the same direction as the bit line. The word selecting signal lines and the main word lines may be arranged on a third layer above the electrode in the same direction as the sub word line. Related methods of signal line arrangement are also discussed.

30 Claims, 15 Drawing Sheets

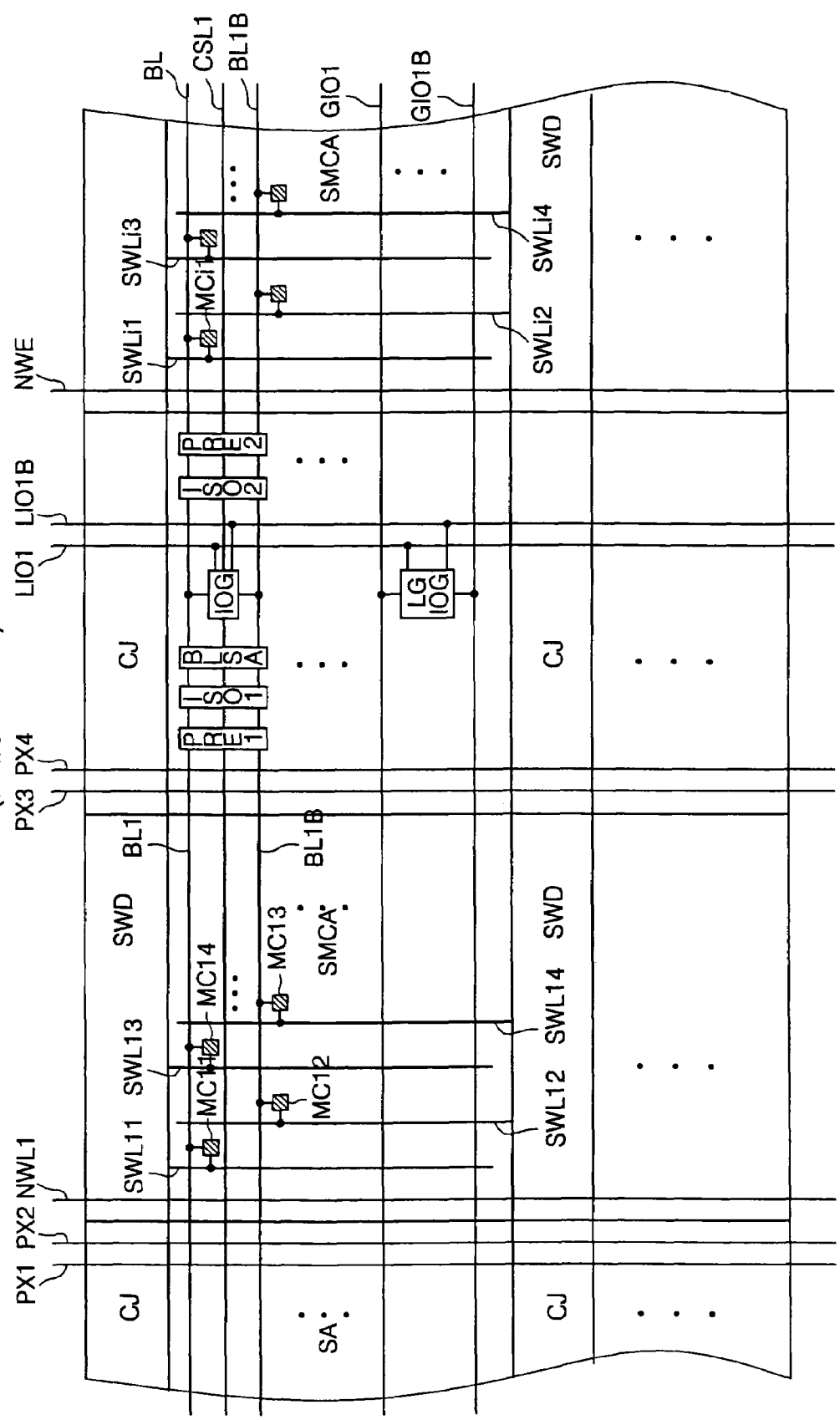

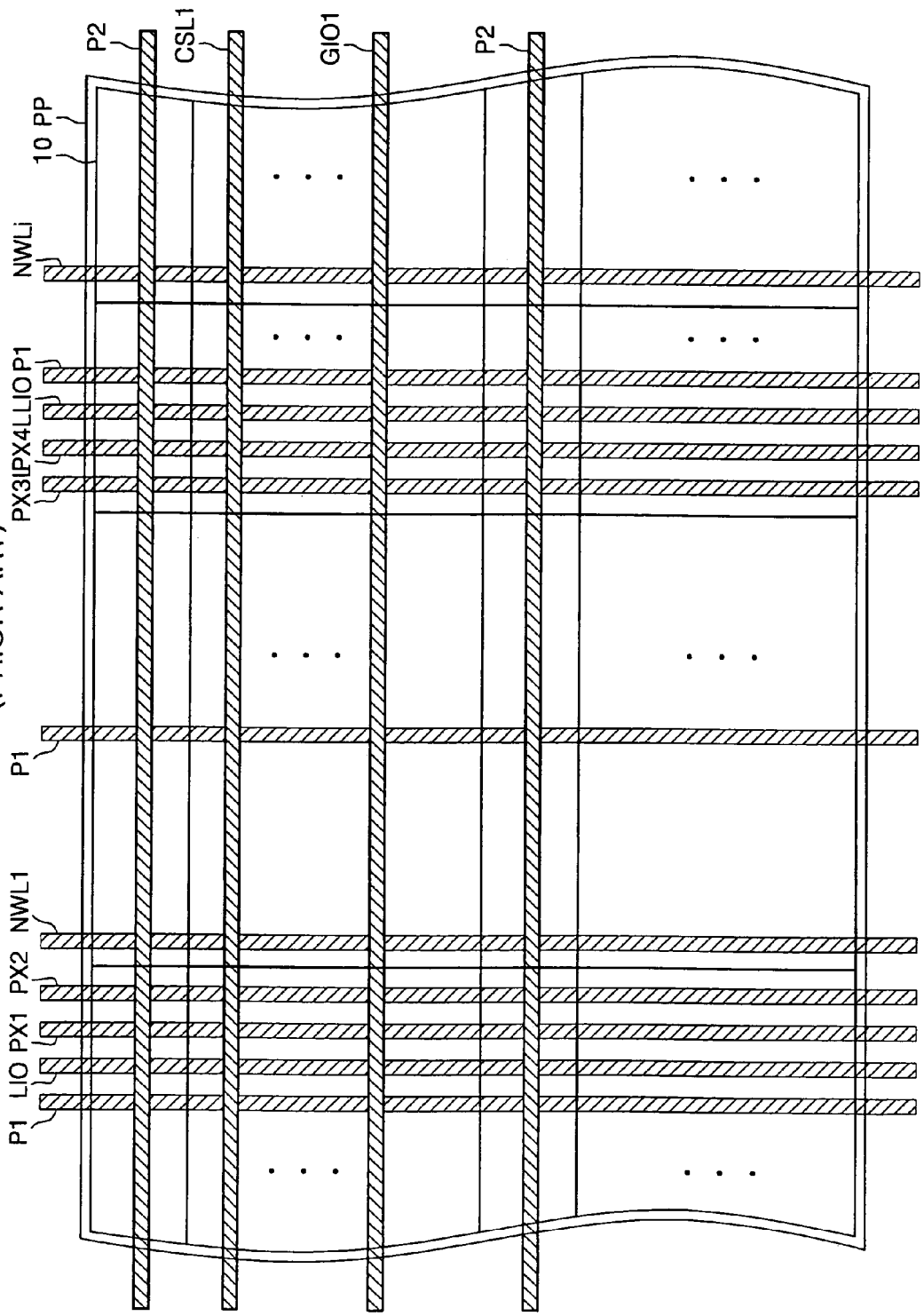

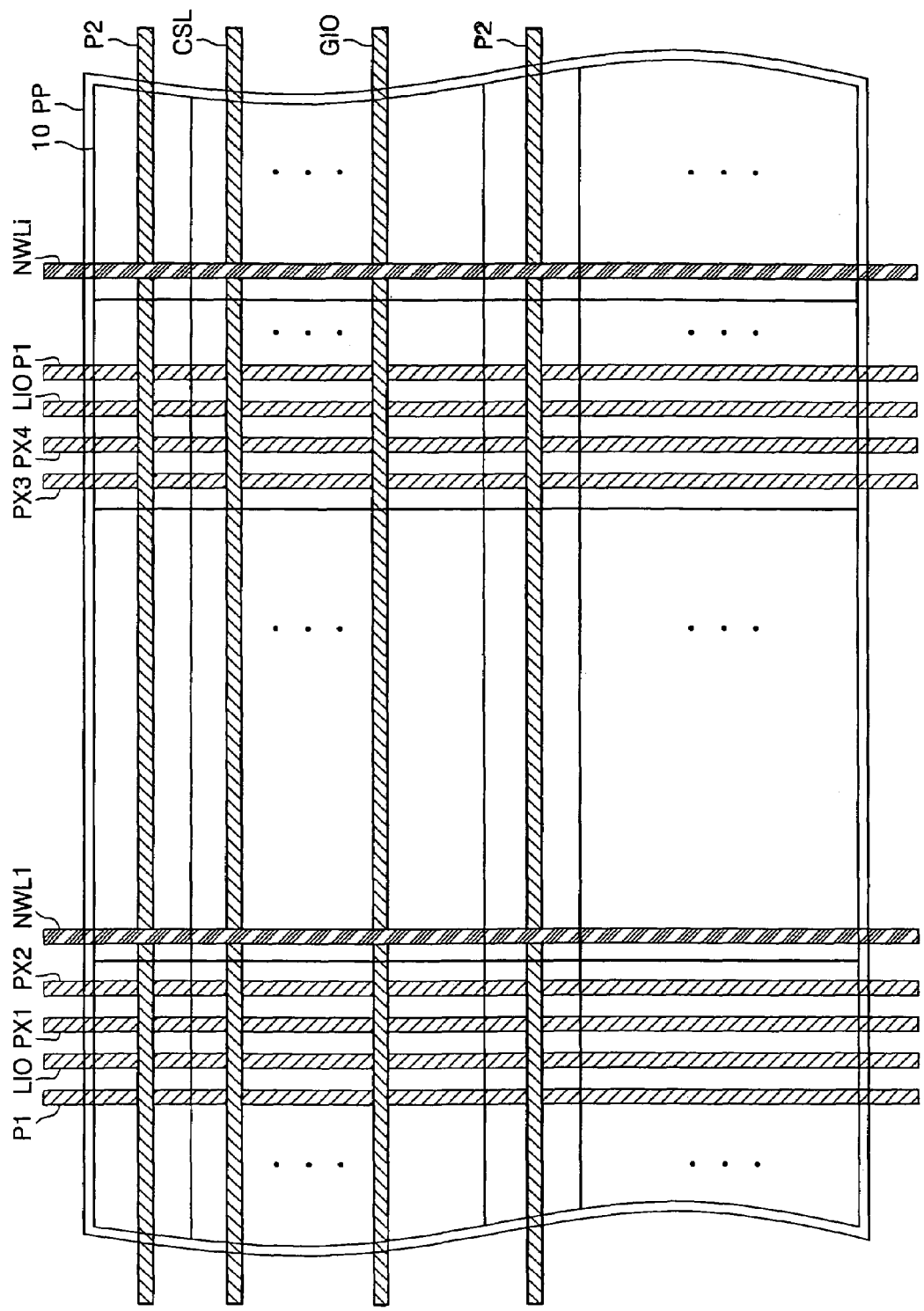

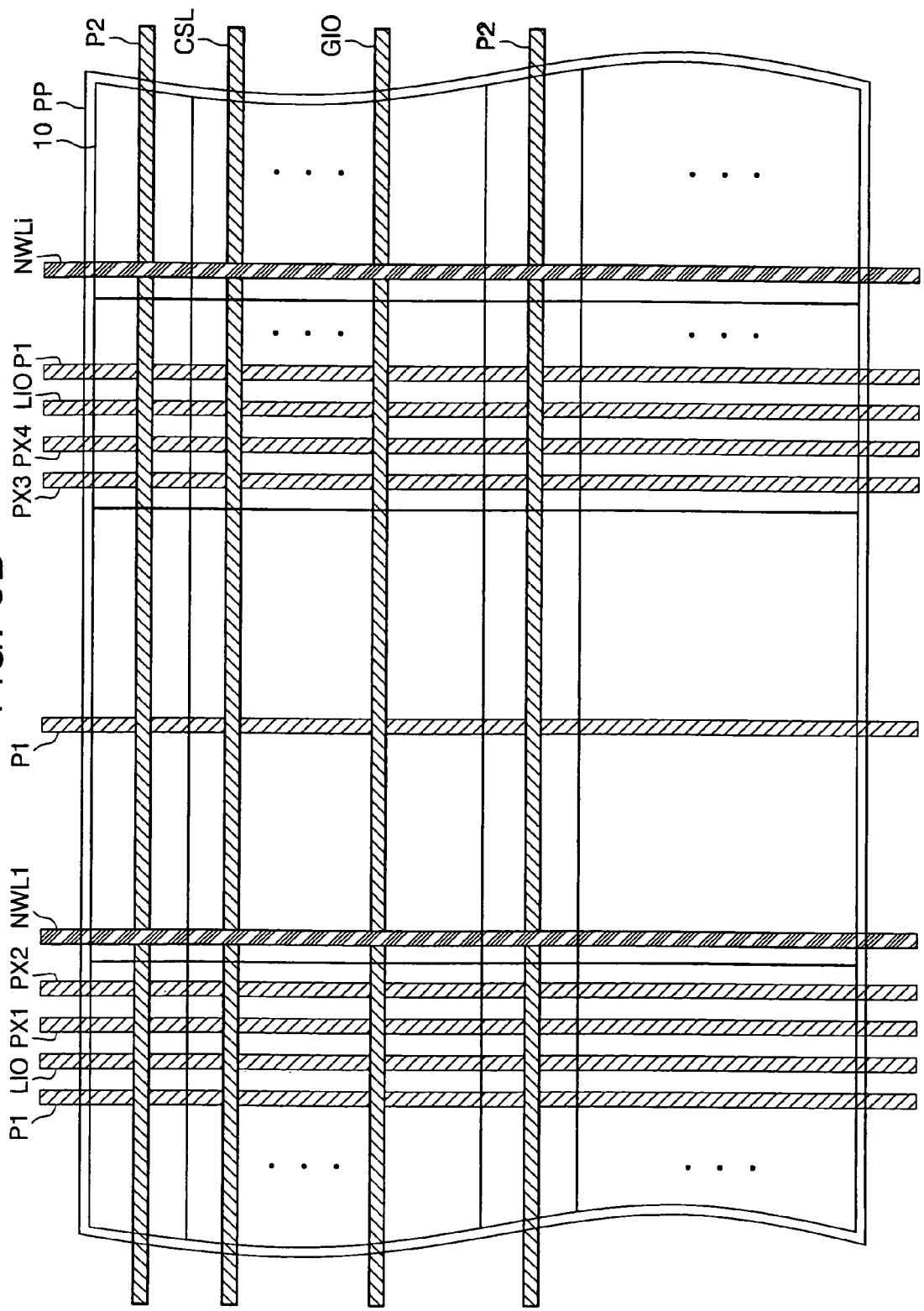

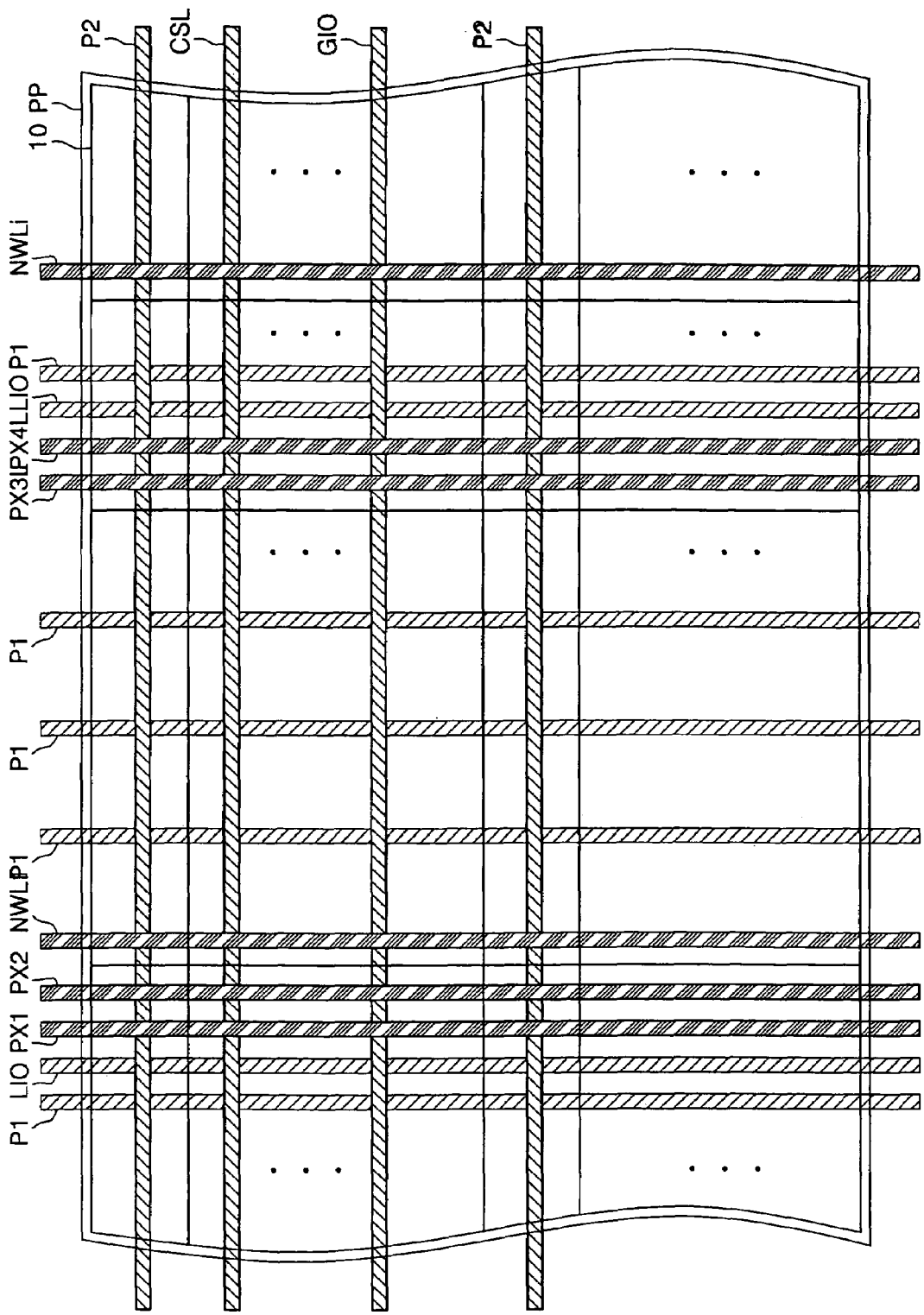

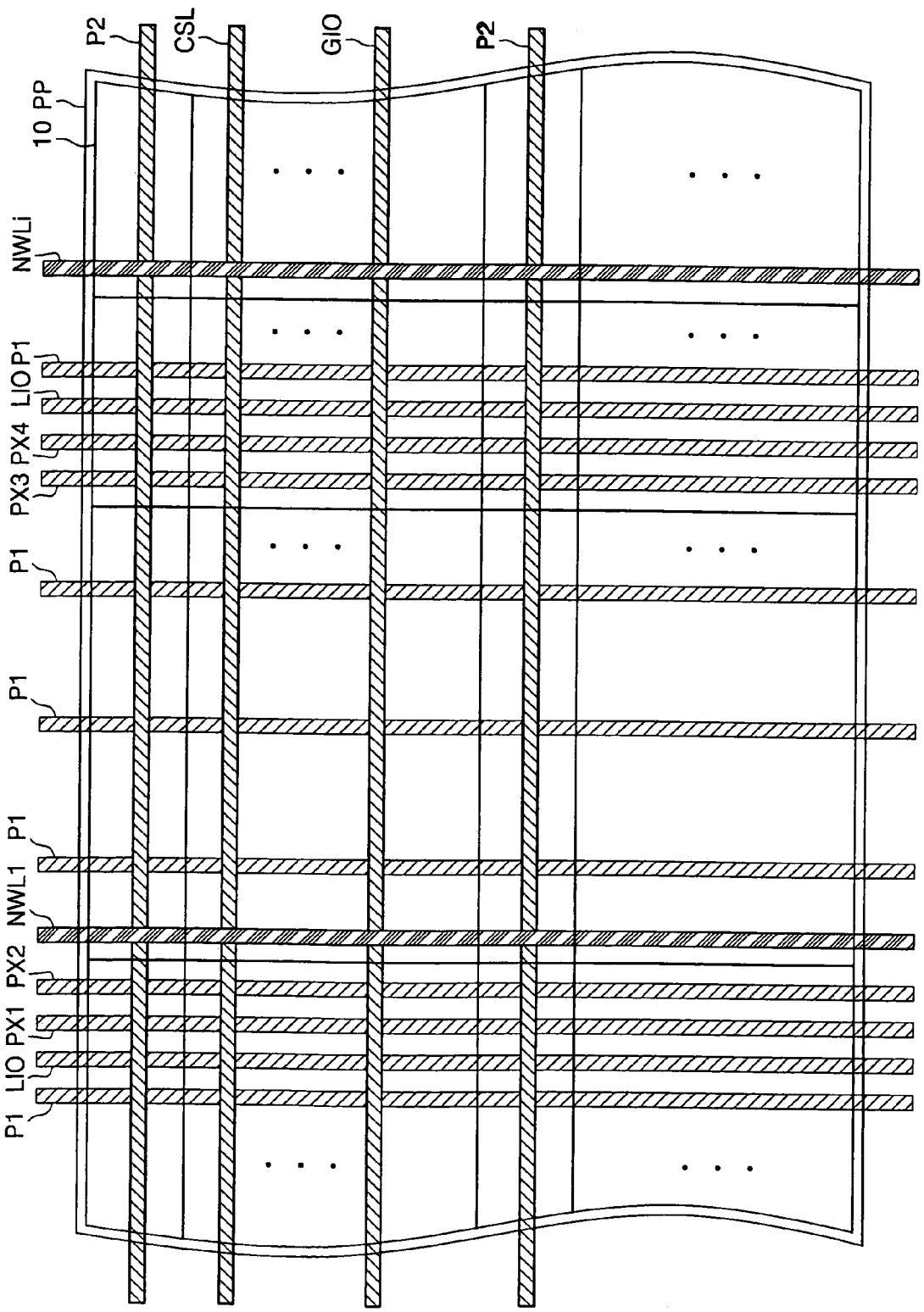

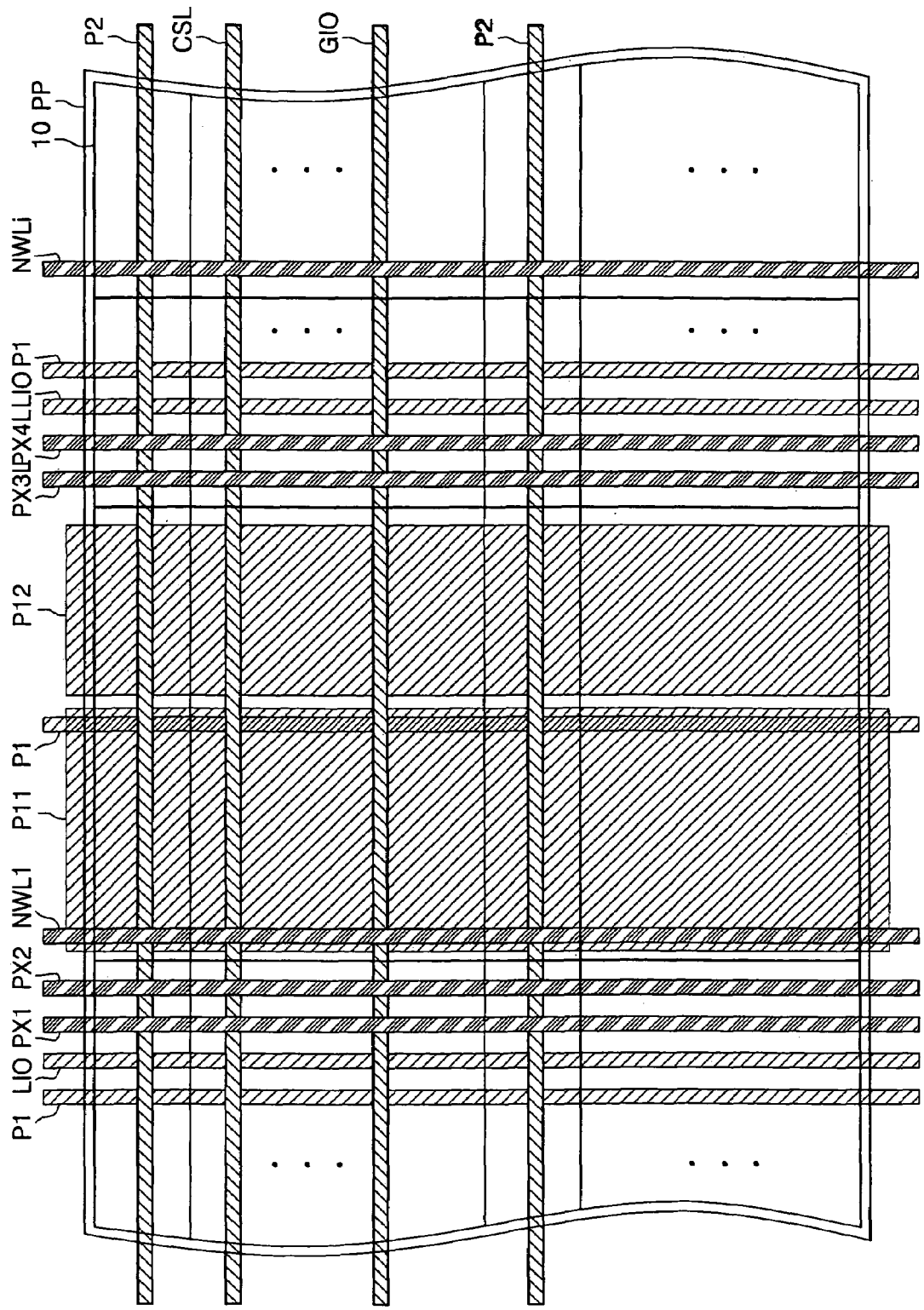

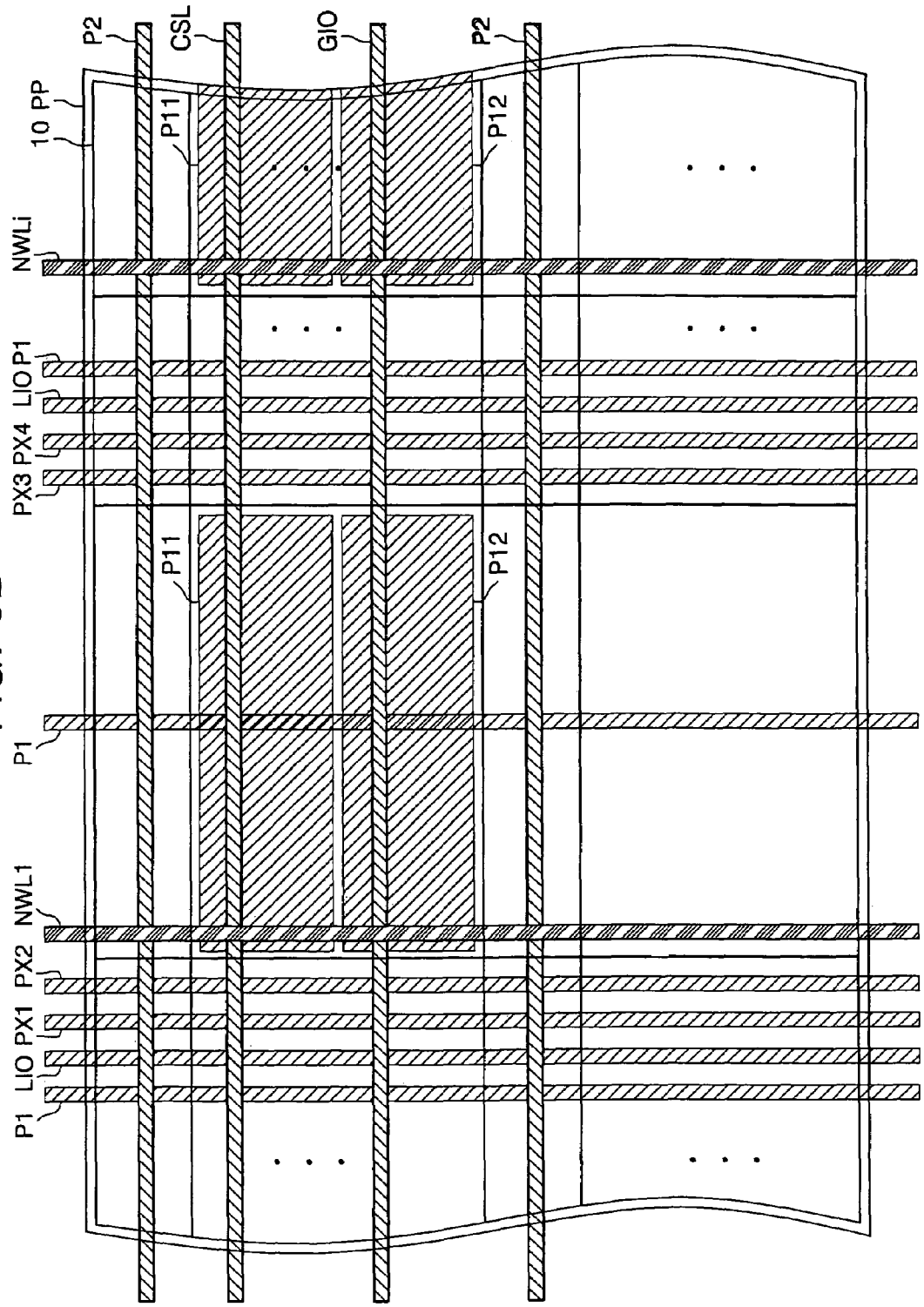

SEMICONDUCTOR MEMORY DEVICES AND SIGNAL LINE ARRANGEMENTS AND RELATED METHODS

RELATED APPLICATION

This application claims the benefit of priority from Korean Patent Application No. 2004-72762, filed on Sep. 10, 2004, in the Korean Intellectual Property Office, the disclosure of which is hereby incorporated herein by reference in its entirety.

FIELD OF THE INVENTION

The present invention relates to semiconductor memory devices and more particularly to signal line arrangements for memory devices and related methods.

BACKGROUND

A semiconductor memory device may include a memory cell array region and a peripheral circuit region, and signal lines may be arranged on two layers above these regions. An electrode to apply a voltage for the memory cells may be arranged between the memory cell region and the signal lines. Word lines are arranged above the electrode, and column selecting lines are arranged above the word lines.

A conventional semiconductor memory device, however, may have a voltage difference between a voltage applied to the electrode and a voltage applied to the word lines. Accordingly, a leakage current may flow from the electrode to the word lines if defects occur in a dielectric between the electrode and the word lines.

FIG. 1 is a block diagram illustrating a memory cell array of a conventional semiconductor memory device and a method of arranging signal lines thereof. In FIG. 1, 10 denotes a memory cell array, CJ denotes junction regions, SWD denotes sub word line driver regions, SA denotes sense amplifier regions, and SMCA denotes sub memory array regions. MC denotes memory cells, BL denotes a bit line, PXL denotes word selecting signal lines, NWL denotes main word lines, SWL denotes sub word lines, CSL denotes column selecting signal lines, LIO denotes local data I/O lines, and GIO denotes global data I/O lines.

In the memory cell array 10 of FIG. 1, blocks which include the junction region CJ, the sub word line driver region SWD, the sense amplifier region SA, and the sub memory cell array region SMCA are repeatedly arranged in transverse and vertical directions. A sub memory cell array is arranged in the sub memory cell array region SMCA. A control signal generating circuit that controls a sub word line driver and a control signal generating circuit that controlls a sense amplifier are arranged in the junction region CJ. Sub word line drivers are arranged in the sub word line driver region SWD, and the sense amplifier is arranged in the sense amplifier region SA. Functions of the components and signal line arrangements of the semiconductor memory device of FIG. 1 will be explained below.

Each sub memory cell array region SMCA includes a memory cell MC connected between a sub word line SWL and a bit line BL to write/read data to/from the selected memory cell MC. The sense amplifier of the sense amplifier region SA amplifies data of the bit line. The sub word line driver region SWD combines signals transmitted to a word selecting signal line PXL and a main word line NWL to select the sub word line.

The sub word line is arranged in a vertical direction, and the bit line BL is arranged in a transverse direction. The column selecting signal line CSL is arranged in the same direction as the bit line to cross over the sense amplifier region SA and the sub memory cell array region SMCA, and the main word line is arranged in the same direction as the sub word line SWL to cross over the sub word line driver region SWD and the sub memory cell array region SMCA. The word line selecting signal line PXL is arranged in the same direction as the sub word line SWL to cross over the junction region CJ and the sense amplifier region SA.

FIG. 2A is a block diagram illustrating an embodiment of the sub memory cell array region SMCA and the sense amplifier region SA of the conventional memory device of FIG. 1. FIG. 2A shows that two word selecting signal lines PX1 and PX2, and two word selection signal lines PX3 and PX4 are respectively arranged on left and right sides of the sub memory cell array region SMCA. Two-least significant bit (LSBs) row addresses among row addresses are decoded to select the word selecting signal lines PX1 to PX4, and the remaining-LSB row addresses among the row addresses are decoded to select the main word lines NWL1 to NWLi, etc.

FIG. 2B is a block diagram illustrating an alternative sub memory cell array region SMCA and the sense amplifier region SA of the conventional memory device of FIG. 1. The configuration of FIG. 2B is the same as that of FIG. 2A except that a bit line pair BL1, BL1B arranged to cross over the sub memory cell array region SMCA is twisted.

In FIGS. 2A and 2B, respective sub word lines SWL11 to SWL14 are selected by combining respective signals transmitted through the word selecting signal lines PX1 to PX4 and a signal transmitted to the main word line NWL1, and respective sub word lines SWLi1 to SWLi4 are selected by combining respective signals transmitted through the word selecting signal lines PX1 to PX4 and a signal transmitted to the main word line NWLi. Each of the memory cells MC11 to MC14 are connected between each of the sub word lines SWL11 to SWL14 and one of the bit line pair BL1, BL1B. Each of the memory cells MCi1 to MCi4 are connected between each of the sub word lines SWLi1 to SWLi4 and one of the bit line pair BL1, BL1B.

Pre-charge circuits PRE1 and PRE2, bit line isolation gates ISOG1 and ISOG2, and a bit line sense amplifier BLSA are connected between the bit line pair BL1, BL1B. An I/O gate IOG is connected between the bit line pair BL1, BL1B and a local data I/O line pair LIO1, LIO1B. A local global I/O gate LGIOG is connected between the local data I/O line pair LIO1, LIO1B and a global data I/O line pair GIO1, GIO1B. Functions of the components of FIGS. 2A and 2B will be explained below.

The pre-charge circuits PRE1 and PRE2 precharge the bit line pair BL1, BL1B. Each of the bit line isolation gates ISO1 and ISO2 separates the bit line pair BL1, BL1B. If a memory cell on the left side of the bit line pair BL1, BL1B is selected, the bit line isolation gate ISO1 is turned on, and the bit line isolation gate ISO2 is turned off. If a memory cell on the right side of the bit line pair BL1, BL1B is selected, the bit line isolation gate ISO1 is turned off, and the bit line isolation gate ISO2 is turned on. The bit line sense amplifier BLSA senses and amplifies data of the bit line pair BL1, BL1B. The I/O gate IOG transmits data between the bit line pair BL1, BL1B and the local data I/O line pair LIO1, LIO1B, and the global I/O data gate LGIOG transmits data between the local data I/O line pair LIO1, LIO1B and the global data I/O line pair GIO1, GIO1B.

Even though the local data line pair LIO1, LIO1B appear to be arranged above the memory cell array 10 in a transverse direction, the local data line pair LIO1, LIO1B is actually arranged in a unit of a predetermined number of sub memory cell array regions SMCA which are arranged in a vertical direction.

FIG. 3A shows a signal line arrangement of the semiconductor memory device of FIG. 2A. In FIG. 3A, a plate poly PP covers the whole surface of the memory cell array 10. The word selecting signal lines PX1 to PX4 are arranged in a vertical direction, the main word lines NWL1 to NWLi, etc., and the local data I/O lines LIO are arranged on a first layer, and power lines P1 are arranged between the word selecting signal lines PX1 to PX4. Column selecting signal lines CSL1 are arranged in a transverse direction, and the global data I/O lines GIO1 are arranged on a second layer. A power line P2 is arranged between the column selecting signal line CSL1 and the global data I/O line GIO.

FIG. 3B shows a signal line arrangement of the semiconductor memory device of FIG. 2B. In FIG. 3B, a power line P1 is additionally arranged in a central region in which the bit line pair of the sub memory cell array region SMCA arranged in a vertical direction is twisted.

That is, in the semiconductor memory device of FIG. 2B, the main word line pairs NWL1 to NWLi, etc. are not arranged in a central region in which the twisted bit line pair is arranged. Accordingly, the power line P1 is additionally arranged in this region. A signal line may also be arranged in this region.

A dynamic memory cell MC of FIGS. 2A and 2B includes one capacitor and one transistor. One side of the capacitor is connected to the transistor, and the other side is connected to the plate poly PP. One half of an array inside power voltage is applied to the plate poly PP; a high voltage VPP is applied to one of the word selecting signal lines PX1 to PX4 and one of the main word lines NWL1 to NWLi, etc. which are selected when it is in active status; and a ground voltage or a voltage of lower level than a ground voltage is applied to the remaining word selecting signal lines PX1 to PX4 and the remaining main word lines NWL1 to NWLi, etc. which are not selected. When it is in standby status, a ground voltage or a voltage of lower level than a ground voltage is applied to all word selecting signal lines PX1 to PX4 and all main word lines NWL1 to NWLi, etc.

Thus, the plate poly PP and the word selecting signal lines PX1 to PX4 and the main word lines NWL1 to NWLi, etc. are arranged closely, and a dielectric provided between these lines may be relatively thin. Leakage current may thus flow between the plate poly PP and the word selecting signal lines PX1 to PX4 and the main word lines NWL1 to NWLi, etc. due to dielectric defect(s).

That is, leakage current may flow from the plate poly PP to which (array inside power voltage)/2 is applied in active or standby status to the word selecting signal lines PX1 to PX4 and the main word lines NWL1 to NWLi, etc. to which a ground voltage or a voltage of lower level than a ground voltage is applied. A voltage applied to the plate poly PP may thus be lower than the (array inside power voltage)/2, thereby adversely affecting operation of the semiconductor memory device.

SUMMARY

According to some embodiments of the present invention, a semiconductor memory device may include a memory cell array having a sub memory cell array, a bit line sense amplifier, and a sub word line driver; and an electrode on the memory cell array. The sub memory cell array may be connected between sub word lines and bit line pairs and with memory cells which are selected in response to signals transmitted to the sub word lines and column selecting signal lines. The bit line sense amplifier may be configured to sense and amplify data of the bit line pairs, and the sub word line driver may be configured to combine signals transmitted from word selecting signal lines and signals transmitted from main word lines to select the sub word lines. Moreover, the memory cell array may be configured to transmit data between the bit line pairs and local data line pairs and to transmit data between the local data line pairs and global data line pairs. The electrode may be configured to apply a voltage for the memory cells. More particularly, the local data line pairs, the word selecting signal lines, and the main word lines may be arranged in a same direction as the sub word lines. The column selecting signal lines and the global data line pairs may be arranged in a same direction as the bit line pairs. In addition, at least one of the column selecting signal lines and/or at least one of the global data lines may be between at least one of the word selecting signal lines and the electrode at an intersection thereof.

More particularly, the electrode may include a plate electrode. Local data lines of the local data line pairs may be between global data lines of the global data line pairs and the electrode at intersections thereof, and/or local data lines of the local data line pairs may be between column selecting lines and the electrode at intersections thereof. In addition, the memory device may include a first insulating layer on the electrode, a second insulating layer on the first insulating layer and on the local data line pairs, and a third insulating layer on the second insulating layer, on the column selecting signal lines, and on the global data line pairs. The first insulating layer may be between at least one of the local data lines of the local data line pairs and the electrode. The second insulating layer may be between at least one of the local data lines of the local data line pairs and at least one of the global data lines of the global data line pairs at an intersection thereof, and/or the second insulating layer may be between at least one of the local data lines of the local data line pairs and at least one of the column selecting lines at an intersection thereof. The third insulating layer may be between at least one of the word selecting signal lines and at least one of the column selecting signal lines at an intersection thereof, and/or the third insulating layer may be between at least one of the word selecting signal lines and at least one of the global data lines at an intersection thereof.

At least one of the column selecting signal lines and/or at least one of the global data lines may be between at least one of the main word lines and the electrode at an intersection thereof. Moreover, a ground voltage or less may be applied if the word selecting signal lines and the main word lines are not selected.

The semiconductor memory device may also include first and second power lines. The first power lines may be arranged in a same direction as the word selecting signal lines and at least one of the first power lines may be between the electrode, and at least one of the global data lines and/or the column selecting signal lines at an intersection thereof. The second power lines may be arranged in a same direction as the column selecting signal lines, and at least one of the second power lines may be between at least one of the word selecting signal lines and the electrode at an intersection thereof.

At least one of the first power lines may be configured to cross a region including the bit line sense amplifier, and at least one of the first power lines may be further configured to cross a region including the sub memory cell array. Moreover, the at least one of the first power lines may include a conductive plate covering the region including the sub memory cell array. In addition, the first power lines may include a first conductive plate crossing a region including the bit line sense amplifier and a second conductive plate crossing a region including the sub memory cell array, and substantially uniform leakage currents may flow between the electrode and each of the first and second conductive plates. Moreover, a first voltage may be applied to the first conductive plate, a second voltage may be applied to the second conductive plate, and a third voltage may be applied to the electrode. One of the first and second voltages may be less than the third voltage, and the other of the first and second voltages may be greater than the third voltage.

According to other embodiments of the present invention, a semiconductor memory device may include a memory cell array having a sub memory cell array, a bit line, and a sub word line driver, and an electrode on the memory cell array. The sub memory cell array may be connected between sub word lines and bit line pairs and may have memory cells which are selected in response to signals transmitted to the sub word lines and column selecting signal lines. The bit line sense amplifier may be configured to sense and amplify data of the bit line pairs, and the sub word line driver may be configured to combine signals transmitted from word selecting signal lines and signals transmitted from main word lines to select the sub word lines. In addition, the memory cell array may be configured to transmit data between the bit line pairs and local data line pairs and to transmit data between the local data line pairs and global data line pairs. The electrode may be configured to apply a voltage for the memory cells. Moreover, the local data line pairs, the word selecting signal lines, and the main word lines may be arranged in a same direction as the sub word lines, and the column selecting signal lines and the global data line pairs may be arranged in a same direction as the bit line pairs. In addition, at least one of the column selecting signal lines and/or at least one of the global data lines may be between at least one of the main word lines and the electrode at an intersection thereof.

The electrode may include a plate electrode. In addition, local data lines of the local data line pairs may be between global data lines of the global data line pairs and the electrode at intersections thereof, and/or local data lines of the local data line pairs may be between column selecting lines and the electrode at intersections thereof. The semiconductor memory device may also include a first insulating layer on the electrode, a second insulating layer on the first insulating layer and on the local data line pairs, and a third insulating layer on the second insulating layer, on the global data line pairs, and on the column selecting signal lines. The first insulating layer may be between at least one of the local data lines of the local data line pairs and the electrode. The second insulating layer may be between at least one of the local data lines of the local data line pairs and at least one of the global data lines of the global data line pairs at an intersection thereof, and/or the second insulating layer may be between at least one of the local data lines of the local data line pairs and at least one of the column selecting lines at an intersection thereof. The third insulating layer may be between at least one of the main word lines and at least one of the column selecting signal lines at an intersection thereof, and/or the third insulating layer may be between at least one of the main word lines and at least one of the global data lines at an intersection thereof.

At least one of the column selecting signal lines and/or at least one of the global data lines may be between at least one of the word selecting signal lines and the electrode at an intersection thereof. In addition, a ground voltage or less may be applied if the word selecting signal lines and the main word lines are not selected.

The semiconductor memory device may also include first power lines arranged in a same direction as the word selecting signal lines and second power lines arranged in a same direction as the column selecting signal lines. Moreover, at least one of the first power lines may be between the electrode and at least one of the global data lines and/or the column selecting signal lines at an intersection thereof, and at least one of the second power lines may be between at least one of the main word lines and the electrode at an intersection thereof. At least one of the first power lines may be configured to cross a region including the bit line sense amplifier, and at least one of the first power lines may be further configured to cross a region including the sub memory cell array. In addition, the at least one of the first power lines may include a conductive plate covering the region including the sub memory cell array. The first power lines may include a first conductive plate crossing a region including the bit line sense amplifier and a second conductive plate crossing a region including the sub memory cell array, and substantially uniform leakage currents may flow between the electrode and each of the first and second conductive plates. Moreover, a first voltage may be applied to the first conductive plate, a second voltage may be applied to the second conductive plate, a third voltage may be applied to the electrode. More particularly, one of the first and second voltages may be less than the third voltage, and the other of the first and second voltages may be greater than the third voltage.

According to some embodiments of the present invention, a semiconductor memory device may be provided with a reduced drop of voltage level applied to a plate poly. According to additional embodiments of the present invention, a signal line arrangement method of a semiconductor memory device may be provided which can reduce a drop of voltage level applied to a plate poly.

According to embodiments of the present invention, a semiconductor memory device may include a memory cell array having a sub memory cell array, a bit line sense amplifier, and a sub word line driver; and an electrode on the memory cell array. The sub memory cell array may be connected between sub word lines and bit line pairs and may have memory cells which are selected in response to a signal transmitted to the sub word lines and column selecting signal lines. The bit line sense amplifier may sense and amplify data of the bit line pairs. The sub word line driver may combine signals transmitted from word selecting signal lines and signals transmitted from main word lines to select the sub word lines, and the memory cell array may transmit data between the bit line pairs and local data line pairs and may transmit data between the local data line pairs and global data line pairs. An electrode may cover a whole memory cell array and may apply a voltage used by the memory cells, wherein the local data line pairs are arranged on a first layer above the electrode in the same direction as the sub word line. The column selecting signal lines and the global data line pairs may be arranged on a second layer above the electrode in the same direction as the bit line, and the word selecting signal lines and the main word lines may be arranged on a third layer above the electrode in the same direction as the sub word line.

According to additional embodiments of the present invention, a semiconductor memory device may include a memory cell array having a sub memory cell array, a bit line sense amplifier, and a sub word line driver; and an electrode on the memory cell arrow. The sub memory cell array may be connected between sub word lines and bit line pairs and may have memory cells which are selected in response to a signal transmitted to the sub word lines and column selecting signal lines. The bit line sense amplifier may sense and amplify data of the bit line pairs. The sub word line driver may combine signals transmitted from word selecting signal lines and signals transmitted from main word lines to select the sub word lines, and the memory cell array may transmit data between the bit line pairs and local data line pairs and may transmit data between the local data line pairs and global data line pairs. The electrode may cover the whole memory cell array and may apply a voltage used by the memory cells. The local data line pairs and the word selecting signal lines may be arranged on a first layer above the electrode in the same direction as the sub word line. The column selecting signal lines and the global data line pairs may be arranged on a second layer above the electrode in the same direction as the bit line, and the main word lines may be arranged on a third layer above the electrode in the same direction as the sub word line.

If the word selecting signal lines and the main word lines are not selected, a ground voltage or a voltage of lower level than a ground voltage may be applied. The semiconductor memory device may further include first and second power lines. The first power lines may be arranged on the first layer above the electrode in the same direction as the word selecting signal lines. The second power lines may be arranged on the second layer above the electrode in the same direction as the column selecting signal lines.

The first power lines may be arranged in the same direction as the word selecting signal lines to cross over regions on which the bit line sense amplifier is arranged. The first power lines may be additionally arranged in the same direction as the word selecting signal lines to cross over regions on which the sub memory cell array is arranged.

The first power lines may include a predetermined number of plates which cover the sub memory cell array region. Leakage current which flows from some of the predetermined number of plates which cover the regions on which the sub memory cell array region is arranged to the electrode and leakage current which flows from the electrode to the remaining plates may be relatively uniform. A voltage which is higher by a predetermined voltage than a voltage applied to the electrode may be applied to some of the plates, and a voltage which is lower by a predetermined voltage than a voltage applied to the electrode is applied to the remaining plates.

According to still additional embodiments of the present invention, a signal line arrangement may be provided for a semiconductor memory device including a memory cell array having a sub memory cell array region, a sense amplifier region, and a sub word line driver region; and an electrode on the memory cell array. The sub memory cell array region may include a sub memory cell array connected between sub word lines and bit line pairs and may have memory cells which are selected in response to a signal transmitted to the sub word lines and column selecting signal lines. The sense amplifier region may include a bit line sense amplifier configured to sense and amplify data of the bit line pairs. The sub word line driver region may include a sub word line driver configured to combine signals transmitted from word selecting signal lines and signals transmitted from main word lines to select the sub word lines. The memory cell array may transmit data between the bit line pairs and local data line pairs and may transmit data between the local data line pairs and global data line pairs.

The electrode may cover the whole memory cell array and may apply a voltage used by the memory cells. More particularly, the local data line pairs on a first layer above the electrode may be arranged in the same direction as the sub word line. The column selecting signal lines and the global data line pairs may be arranged on a second layer above the electrode in the same direction as the bit line. The word selecting signal lines and the main word lines may be arranged on a third layer above the electrode in the same direction as the sub word line.

According to yet additional embodiments of the present invention, a signal line arrangement may be provided for a semiconductor memory device including a memory cell array having a sub memory cell array region, a sense amplifier region, and a sub word line driver region; and an electrode on the memory cell array. The sub memory cell array region may include a sub memory cell array connected between sub word lines and bit line pairs and having memory cells which are selected in response to a signal transmitted to the sub word lines and column selecting signal lines. The sense amplifier region may include a bit line sense amplifier configured to sense and amplify data of the bit line pairs. The sub word line driver region may include a sub word line driver configured to combine signals transmitted from word selecting signal lines and signals transmitted from main word lines to select the sub word lines. Moreover, the memory cell array may transmit data between the bit line pairs and local data line pairs and may transmit data between the local data line pairs and global data line pairs. The electrode may cover the whole memory cell array and may apply a voltage used by the memory cells. More particularly, the local data line pairs and the word selecting signal lines may be arranged on a first layer above the electrode in the same direction as the sub word line. The column selecting signal lines and the global data line pairs may be on a second layer above the electrode in the same direction as the bit line. The main word lines may be arranged on a third layer above the electrode in the same direction as the sub word line.

In addition, first power lines may be arranged on the first layer above the electrode in the same direction as the word selecting signal lines, and second power lines may be arranged on the second layer above the electrode in the same direction as the column selecting signal lines. The first power lines may be arranged in the same direction as the word selecting signal lines to cross over the sense amplifier region. The first power lines may additionally be arranged in the same direction as the word selecting signal lines to cross over the sub memory cell array region.

The first power lines may be arranged in the form of a predetermined number of plates which cover the sub memory cell array region. Leakage current which flows from some of the predetermined number of plates which cover the sub memory cell array region to the electrode and leakage current which flows from the electrode to the remaining plates may be substantially uniform. A voltage which is higher by a predetermined voltage than a voltage applied to the electrode may be applied to some of the plates, and a voltage which is lower by a predetermined voltage than a voltage applied to the electrode is applied to the remaining plates.

BRIEF DESCRIPTION OF THE DRAWINGS

FIG. 2A is a block diagram illustrating a sub memory cell array region and a sense amplifier region of the conventional memory device of FIG. 1.

FIGS. 3A and 3B illustrate signal line arrangements of the semiconductor memory devices of FIGS. 2A and 2B;

FIGS. 5A and 5B illustrate signal line arrangements of semiconductor memory devices according to second embodiments of the present invention.

FIGS. 6A and 6B illustrate signal line arrangements of semiconductor memory devices according to third embodiments of the present invention.

FIGS. 7A and 7B illustrate signal line arrangements of semiconductor memory devices according to fourth embodiments of the present invention.

FIGS. 8A and 8B illustrate signal line arrangements of semiconductor memory devices according to fifth embodiments of the present invention.

DETAILED DESCRIPTION

Figure 1:
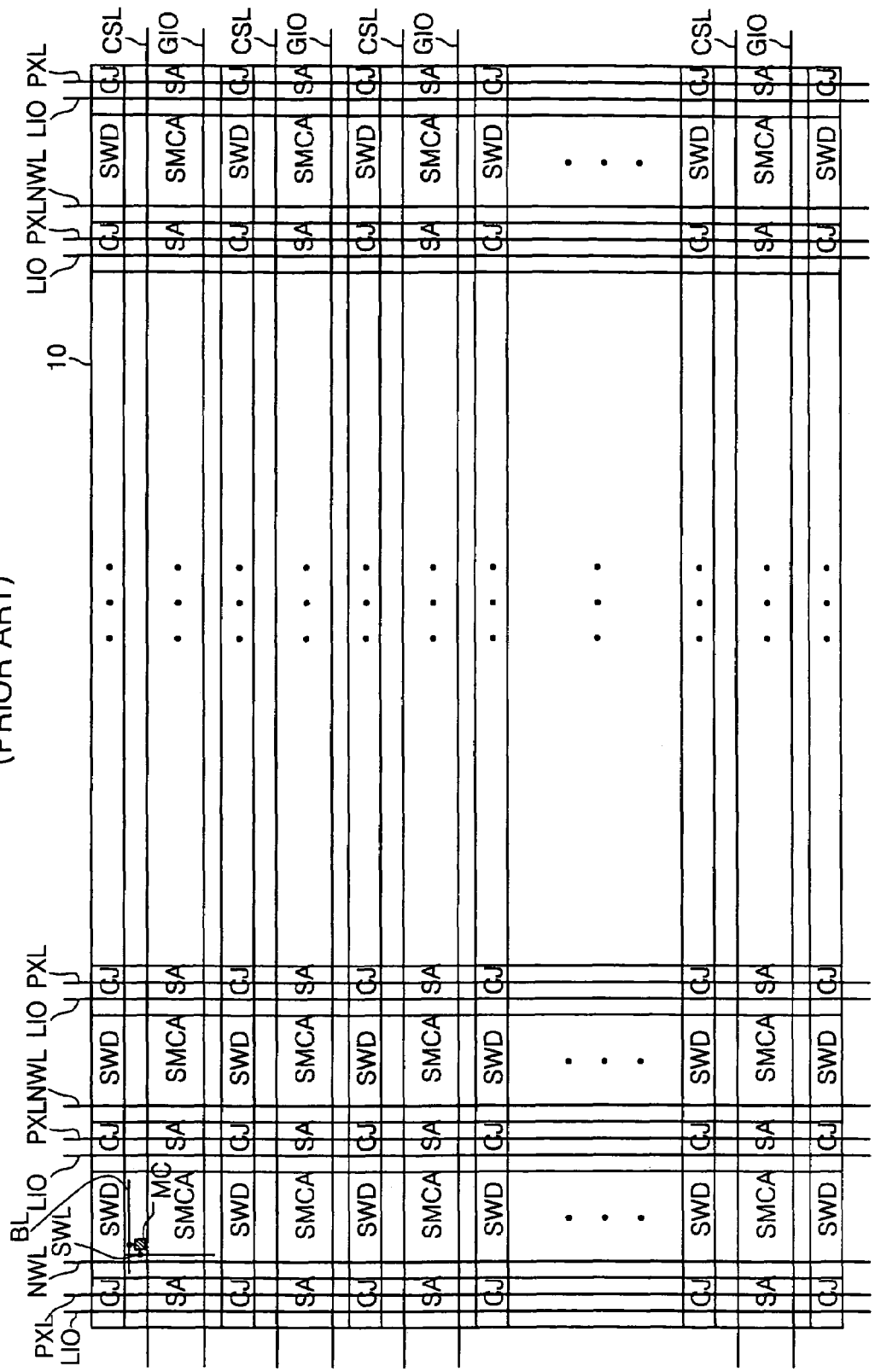
FIG. 1 is a block diagram illustrating a memory cell array of a conventional semiconductor memory device and a method of arranging signal lines thereof.
Figure 2B:
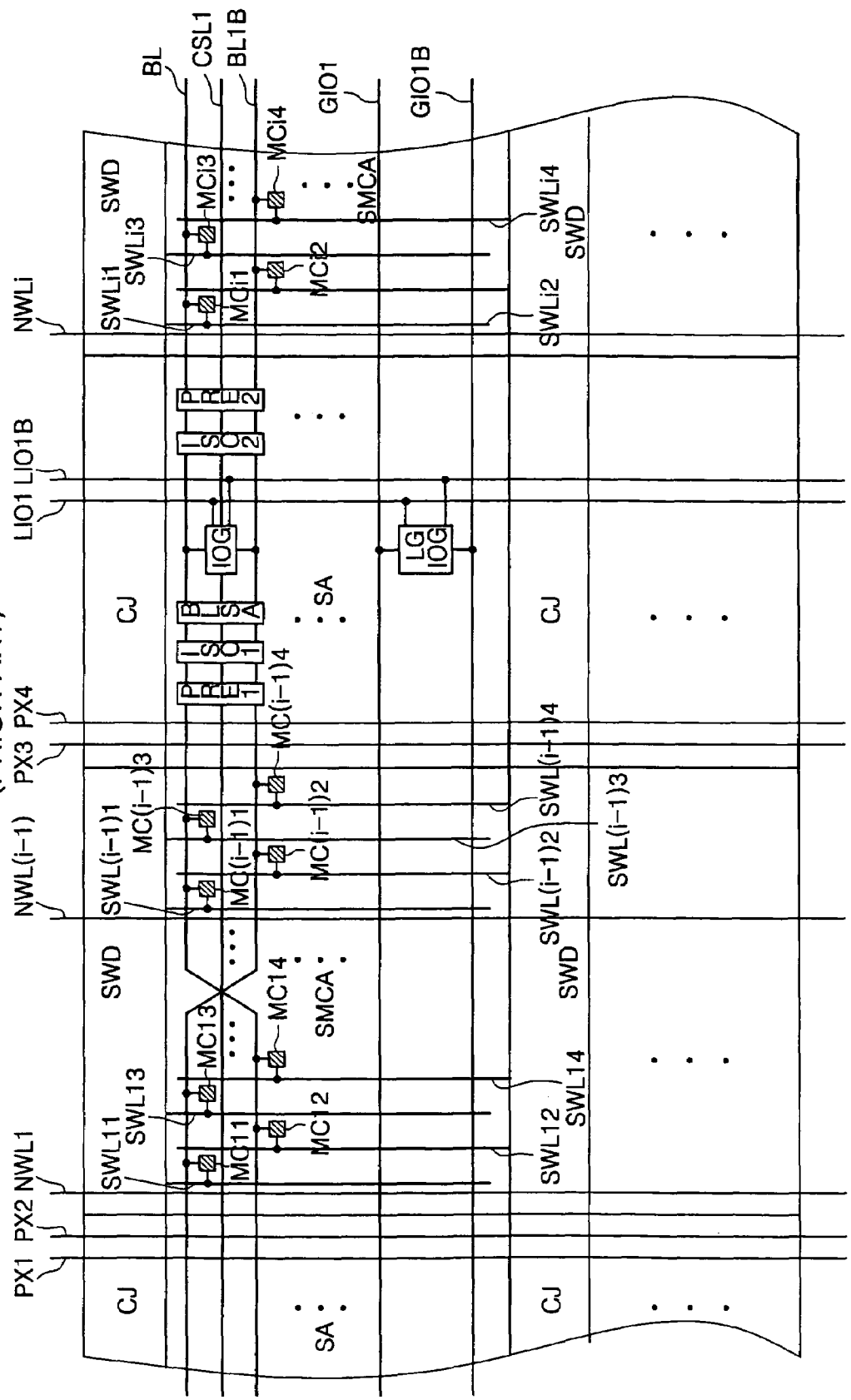
FIG. 2B is a block diagram illustrating an alternative sub memory cell array region and an alternative sense amplifier region of the conventional memory device of FIG. 1.
Figure 3A:
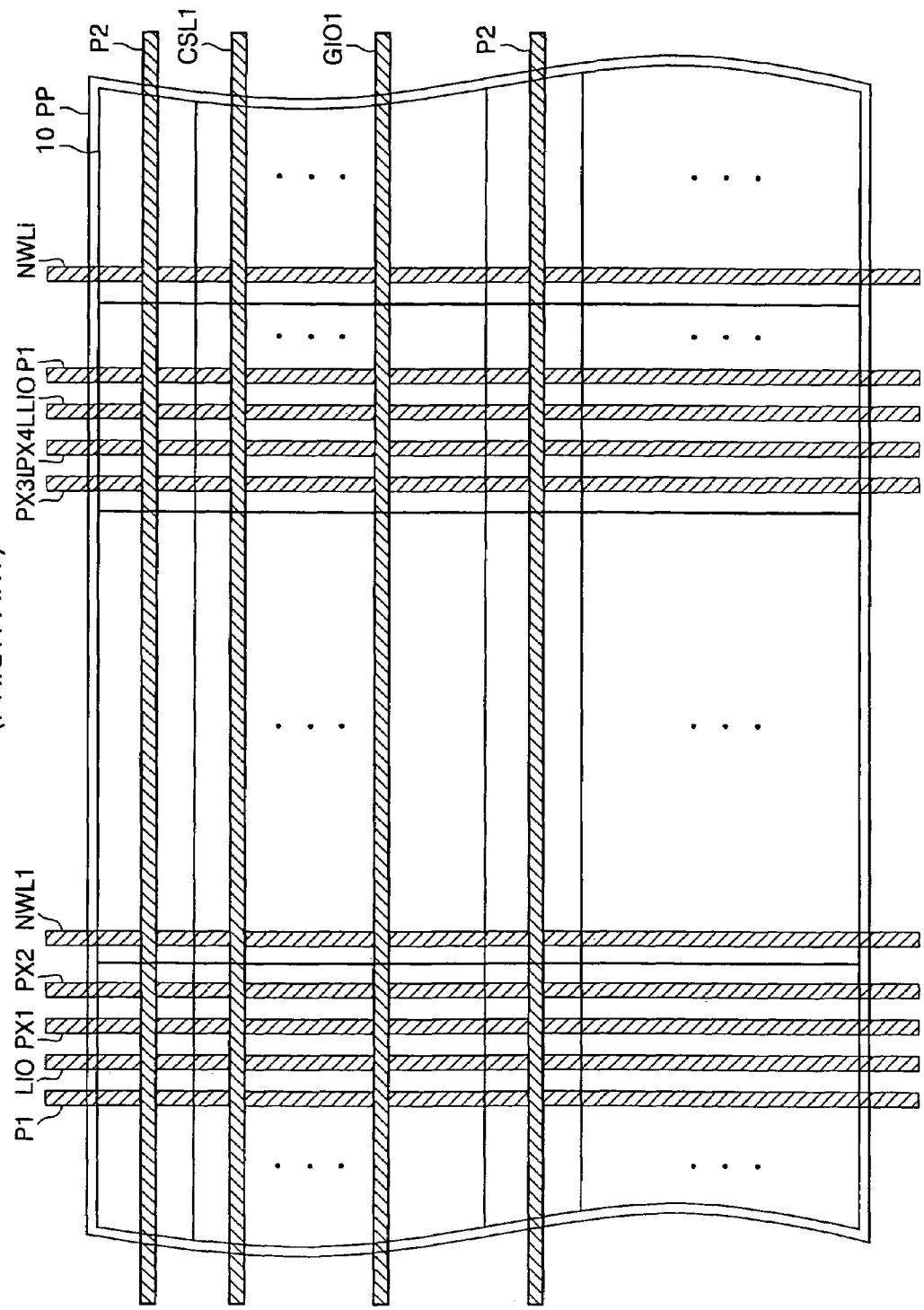

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, thickness and/or widths of layers, regions, and/or lines are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, vertical, transverse, above, below, over, under, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4A:
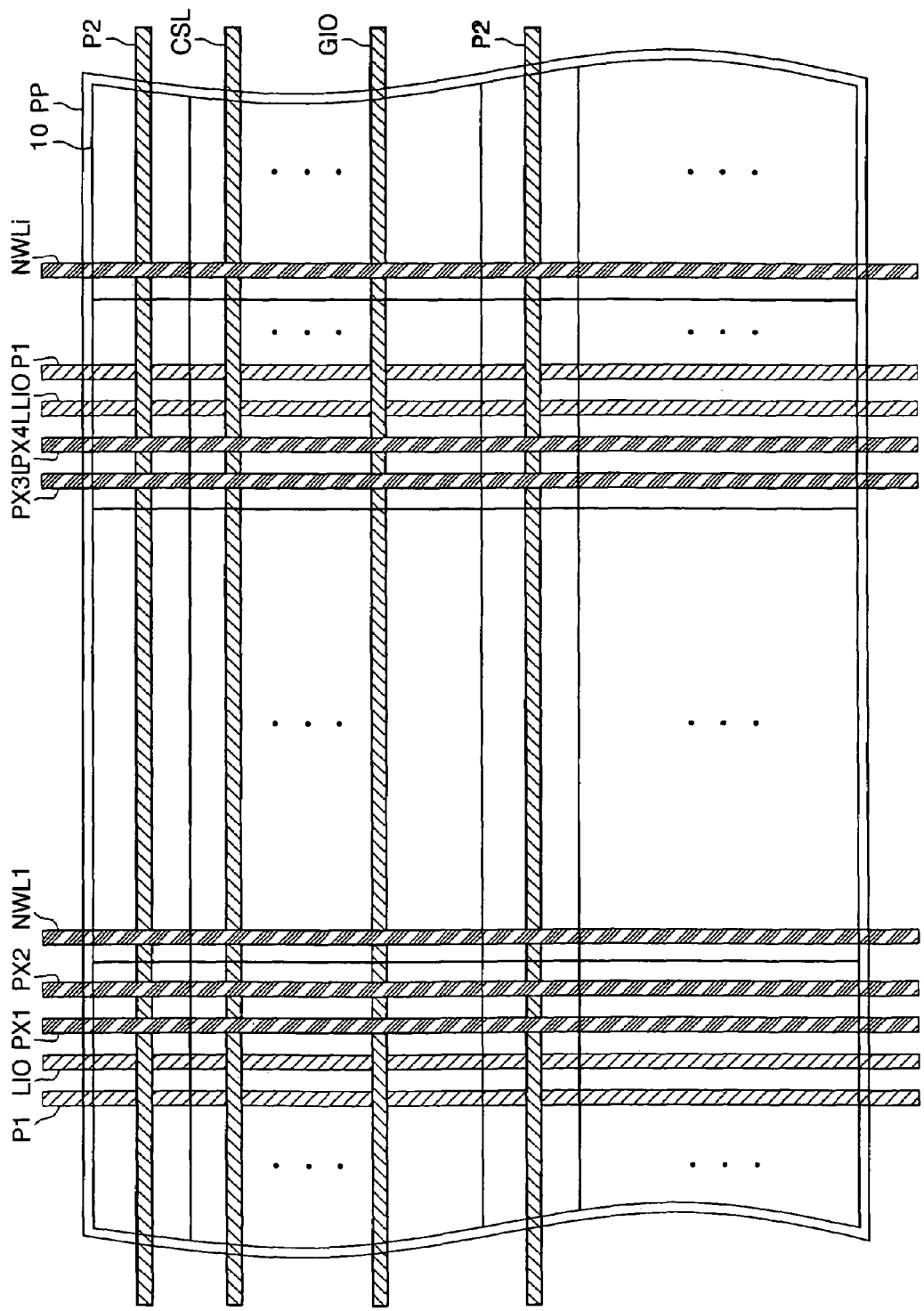
FIGS. 4A and 4B illustrate signal line arrangements of semiconductor memory devices according to first embodiments of the present invention.
Figure 4B:
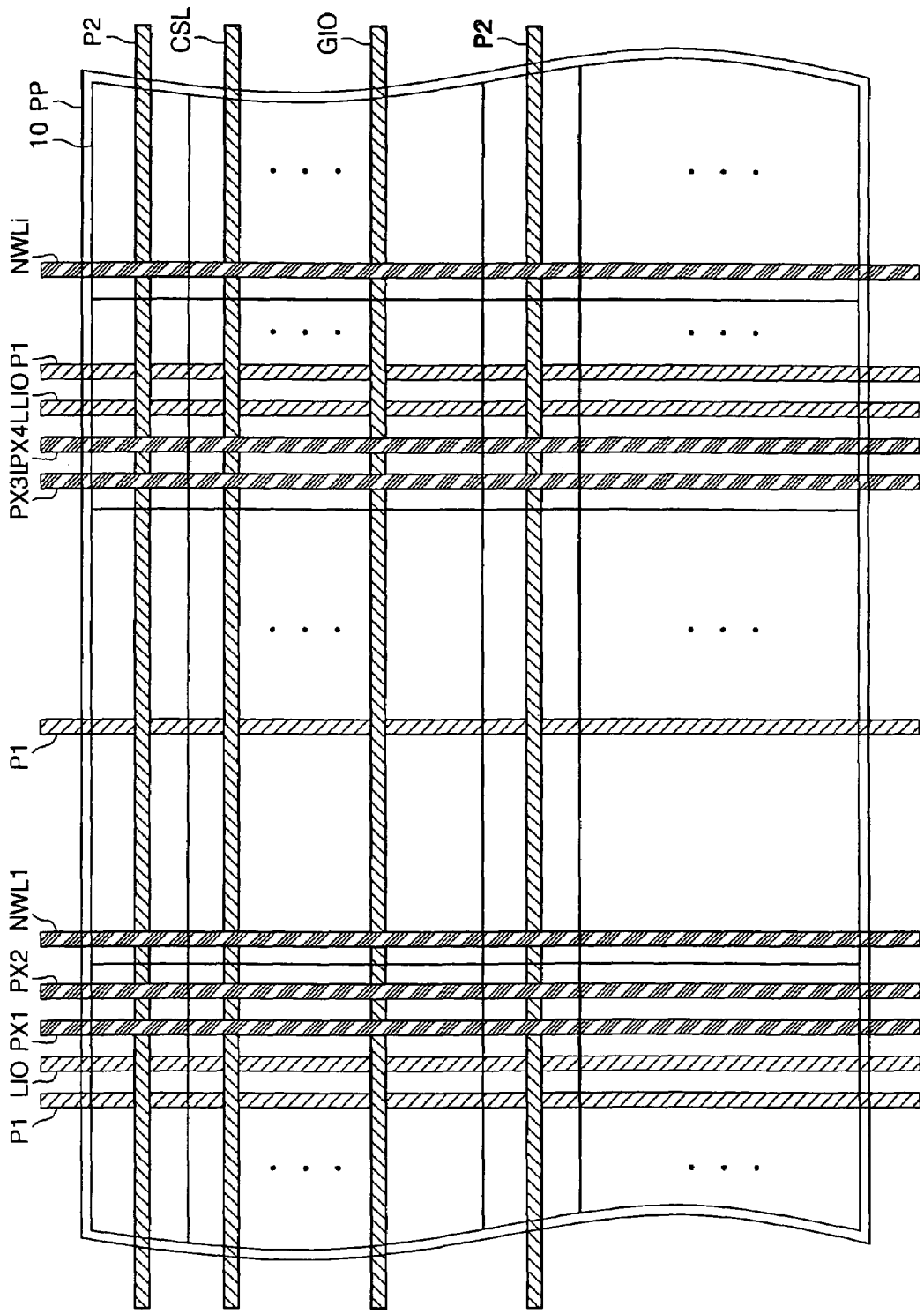

FIGS. 4A and 4B illustrate signal line arrangements of semiconductor memory devices according to first embodiments of the present invention. In signal line arrangements of FIGS. 4A and 4B, the word selecting signal lines PX1 to PX4 and the main word lines NWL1 to NWLi are arranged on a third layer other than a first layer. More particularly, in the semiconductor memory device of FIGS. 4A and 4B, signal lines are arranged on a third layer other than a second layer, and the word selecting signal lines PX1 to PX4 and the main word lines NWL1 to NWLi which are adjacent to the plate poly PP are arranged on a third layer. Electrical and/or logical functionalities of lines and/or electrodes of FIGS. 4A and 4B may be the same as that discussed above with respect to FIGS. 1, 2A-2B, and 3A-3B.

Because the plate poly PP is not closely arranged with respect to the word selecting signal lines PX1 to PX4 and/or the main word lines NWL1 to NWLi, leakage current from the plate poly PP to the word selecting signal lines PX1 to PX4 and/or the main word lines NWL1 to NWLi may be reduced in active and/or standby states, thereby reducing a drop of voltage level applied to the plate poly PP.

In FIGS. 4A and 4B, a first insulating layer may be formed on plate poly PP, and local data lines LIO and power lines P1 may be formed on the first insulating layer. Accordingly, the first insulating layer may be between the local data lines and plate poly PP, and between power lines P1 and plate poly PP. A second insulating layer may be formed on the first insulating layer, on local data lines LIO, and on power lines P1; and column selecting signal lines CSL, global data lines GIO, and power lines P2 may be formed on the second insulating layer. Accordingly, the second insulating layer may be between local data lines LIO and global data lines GIO at intersections thereof; between local data lines LIO and column selecting lines CSL at intersections thereof, between power lines P1 and global data lines GIO at intersections thereof; and between power lines P1 and column selecting lines CSL at intersections thereof. A third insulating layer may be formed on the second insulating layer, on column selecting signal lines CSL, on global data lines GIO, and on power lines P2; and word selecting signal lines PX1 to PX4 and main word lines NWL1 to NWLi may be formed on the third insulating layer. Accordingly, the third insulating layer may be between column selecting signal lines CSL and word selecting signal lines PX1 to PX4 at intersections thereof; between column selecting signal lines CSL and main word lines NWL1 to NWLi at intersections thereof; between global data lines GIO and word selecting signal lines PX1 to PX4 at intersections thereof; and between global data lines GIO and main word lines NWL1 to NWLi at intersections thereof.

Accordingly, at intersections of word selecting signal lines PX1 to PX4 and column selecting signal lines CSL, the column selecting signal line is between the word selecting signal line and plate poly PP. At intersections of the main word lines NWL1 to NWLi and column selecting signal lines CSL, the column selecting signal line is between the main word line and plate poly PP. At intersections of word selecting signal lines PX1 to PX4 and global data lines GIO, the global data line is between the word selecting signal line and plate poly PP. At intersections of the main word lines NWL1 to NWLi and global data lines GIO, the global data line is between the main word line and plate poly PP.

FIGS. 5A and 5B illustrate signal line arrangements of semiconductor memory devices according to second embodiments of the present invention. In signal line arrangements of FIGS. 5A and 5B the main word lines NWL1 to NWLi are arranged on a third layer other than a first layer.

Either the word selecting signal lines PX1 to PX4 and the main word lines NWL1 to NWLi may be arranged on a third layer, or the main word lines NWL1 to NWLi may be arranged on a third layer (with the word selecting signal lines being arranged on a first layer). Thus, a leakage current from the plate poly PP to the word selecting signal lines PX1 to PX4 and/or the main word lines NWL1 to NWLi can be reduced in active and/or standby states, thereby reducing a drop of a voltage level applied to the plate poly PP. As a result, power consumption of the semiconductor memory device can be reduced. Electrical and/or logical functionalities of lines and/or electrodes of FIGS. 5A and 5B may be the same as that discussed above with respect to FIGS. 1, 2A-2B and 3A-3B.

Even though not shown, in the semiconductor memory device of FIGS. 4B and 5B, the power line P1 (which is arranged on a first layer above the sub memory cell array regions SMCA) may be arranged on a third layer, or the power line P1 (which is arranged on a first layer above the sub memory cell array regions SMCA) may be arranged on both a first layer and a third layer.

In FIGS. 5A and 5B, a first insulating layer may be formed on plate poly PP, and local data lines LIO, power lines P1 and word selecting signal lines PX1 to PX4 may be formed on the first insulating layer. Accordingly, the first insulating layer may be between local data lines LIO and plate poly PP; between power lines P1 and the plate poly PP, and between word selecting signal lines PX1 to PX4 and plate poly PP. A second insulating layer may be formed on the first insulating layer, on local data lines LIO, on power lines P1, and on word selecting signal lines PX1 to PX4; and column selecting signal lines CSL, global data lines GIO, and power lines P2 may be formed on the second insulating layer. Accordingly, the second insulating layer may be between local data lines LIO and global data lines GIO at intersections thereof; between local data lines LIO and column selecting lines CSL at intersections thereof; between power lines P1 and global data lines GIO at intersections thereof; between power lines P1 and column selecting lines CSL at intersections thereof; between word selecting signal lines PX1 to PX4 and global data lines at intersections thereof; and between word selecting signal lines PX1 to PX4 and column selecting lines CSL at intersections thereof. A third insulating layer may be formed on the second insulating layer, on column selecting signal lines CSL, on global data lines GIO, and on the power lines P2; and main word lines NWL1 to NWLi may be formed on the third insulating layer. Accordingly, the third insulating layer may be between column selecting signal lines CSL and main word lines NWL1 to NWLi at intersections thereof; and between global data lines GIO and main word lines NWL1 to NWLi at intersections thereof.

Accordingly, at intersections of word selecting signal lines PX1 to PX4 and column selecting signal lines CSL, the word selecting signal line is between the column selecting signal line and plate poly PP. At intersections of main word lines NWL1 to NWLi and column selecting signal lines CSL, the column selecting signal line is between the main word line and the plate poly PP. At intersections of word selecting signal lines PX1 to PX4 and global data lines GIO, the word line selecting signal line is between the global data line and plate poly PP. At intersections of main word lines NWL1 to NWLi and global data line GIO, the global data line is between the main word line and plate poly PP.

FIGS. 6A and 6B illustrate signal line arrangements of semiconductor memory devices according to third embodiments of the present invention. FIG. 6A illustrates signal line arrangements wherein word selecting signal lines PX1 to PX4 and the main word lines NWL1 to NWLi are arranged on a third layer other than a first layer, and the power lines P1 are additionally arranged in an empty region of a first layer above the sub word line driver region SWD and the sub memory cell array region SMCA to cross over these regions. FIG. 6B illustrates signal line arrangements wherein the main word lines NWL1 to NWLi are arranged on a third layer other than a first layer and the power lines P1 are additionally arranged on a first layer like that of FIG. 6A (with the word selecting signal lines being arranged on a first layer). Electrical and/or logical functionalities of lines and/or electrodes of FIGS. 6A and 6B may be the same as discussed above with respect to FIGS. 1, 2A-2B, and 3A-3B.

In FIG. 6A, a first insulating layer may be formed on plate poly PP, and local data lines LIO and power lines P1 may be formed on the first insulating layer. Accordingly, the first insulating layer may be between the local data lines LIO and plate poly PP, and between power lines P1 and plate poly PP. A second insulating layer may be formed on the first insulating layer, on local data lines LIO, and on power lines P1; and column selecting signal lines CSL, global data lines GIO, and power lines P2 may be formed on the second insulating layer. Accordingly, the second insulating layer may be between local data lines LIO and global data lines GIO at intersections thereof, between local data lines LIO and column selecting lines CSL at intersections thereof, between power lines P1 and global data lines GIO at intersections thereof, and between power lines P1 and column selecting lines CSL at intersections thereof. A third insulating layer may be formed on the second insulating layer, on column selecting signal lines CSL, on global data lines GIO, and on the power lines P2; and word selecting signal lines PX1 to PX4 and main word lines NWL1 to NWLi may be formed on the third insulating layer. Accordingly, the third insulating layer may be between column selecting signal lines CSL and word selecting signal lines PX1 to PX4 at intersections thereof, between column selecting signal lines CSL and main word lines NWL1 to NWLi at intersections thereof, between global data lines GIO and word selecting signal lines PX1 to PX4 at intersections thereof; and between global data lines GIO and main word lines NWL1 to NWLi at intersections thereof.

Accordingly, at intersections of word selecting signal lines PX1 to PX4 and column selecting signal lines CSL, the column selecting signal line is between the word selecting signal line and plate poly PP. At intersections of the main word lines NWL1 to NWLi and column selecting signal lines CSL, the column selecting signal line is between the main word line and plate poly PP. At intersections of word selecting signal lines PX1 to PX4 and global data lines GIO, the global data line is between the word selecting signal line and plate poly PP. At intersections of the main word lines NWL1 to NWLi and global data lines GIO, the global data line is between the main word line and plate poly PP.

In FIG. 6B, a first insulating layer may be formed on plate poly PP, and local data lines LIO, power lines P1, and word selecting signal lines PX1 to PX4 may be formed on the first insulating layer. Accordingly, the first insulating layer may be between local data lines LIO and plate poly PP; between power lines P1 and the plate poly PP; and between word selecting signal lines PX1 to PX4 and plate poly PP. A second insulating layer may be formed on the first insulating layer, on local data lines LIO, on power lines P1, and on word selecting signal lines PX1 to PX4; and column selecting signal lines CSL, global data lines GIO, and power lines P2 may be formed on the second insulating layer. Accordingly, the second insulating layer may be between local data lines LIO and global data lines GIO at intersections thereof; between local data lines LIO and column selecting lines CSL at intersections thereof; between power lines P1 and global data lines GIO at intersections thereof; between power lines P1 and column selecting lines CSL at intersections thereof; between word selecting signal lines PX1 to PX4 and global data lines at intersections thereof; and between word selecting signal lines PX1 to PX4 and column selecting lines CSL at intersections thereof. A third insulating layer may be formed on the second insulating layer, on column selecting signal lines CSL, on global data lines GIO, and on power lines P2; and main word lines NWL1 to NWLi may be formed on the third insulating layer. Accordingly, the third insulating layer may be between column selecting signal lines CSL and main word lines NWL1 to NWLi at intersections thereof; and between global data lines GIO and main word lines NWL1 to NWLi at intersections thereof.

Accordingly, at intersections of word selecting signal lines PX1 to PX4 and column selecting signal lines CSL, the word selecting-signal line is between the column selecting signal line and plate poly PP. At intersections of main word lines NWL1 to NWLi and column selecting signal lines CSL, the column selecting signal line is between the main word line and the plate poly PP. At intersections of word selecting signal lines PX1 to PX4 and global data lines GIO, the word line selecting signal line is between the global data line and plate poly PP. At intersections of main word lines NWL1 to NWLi and global data line GIO, the global data line is between the main word line and plate poly PP.

Figure 7B:
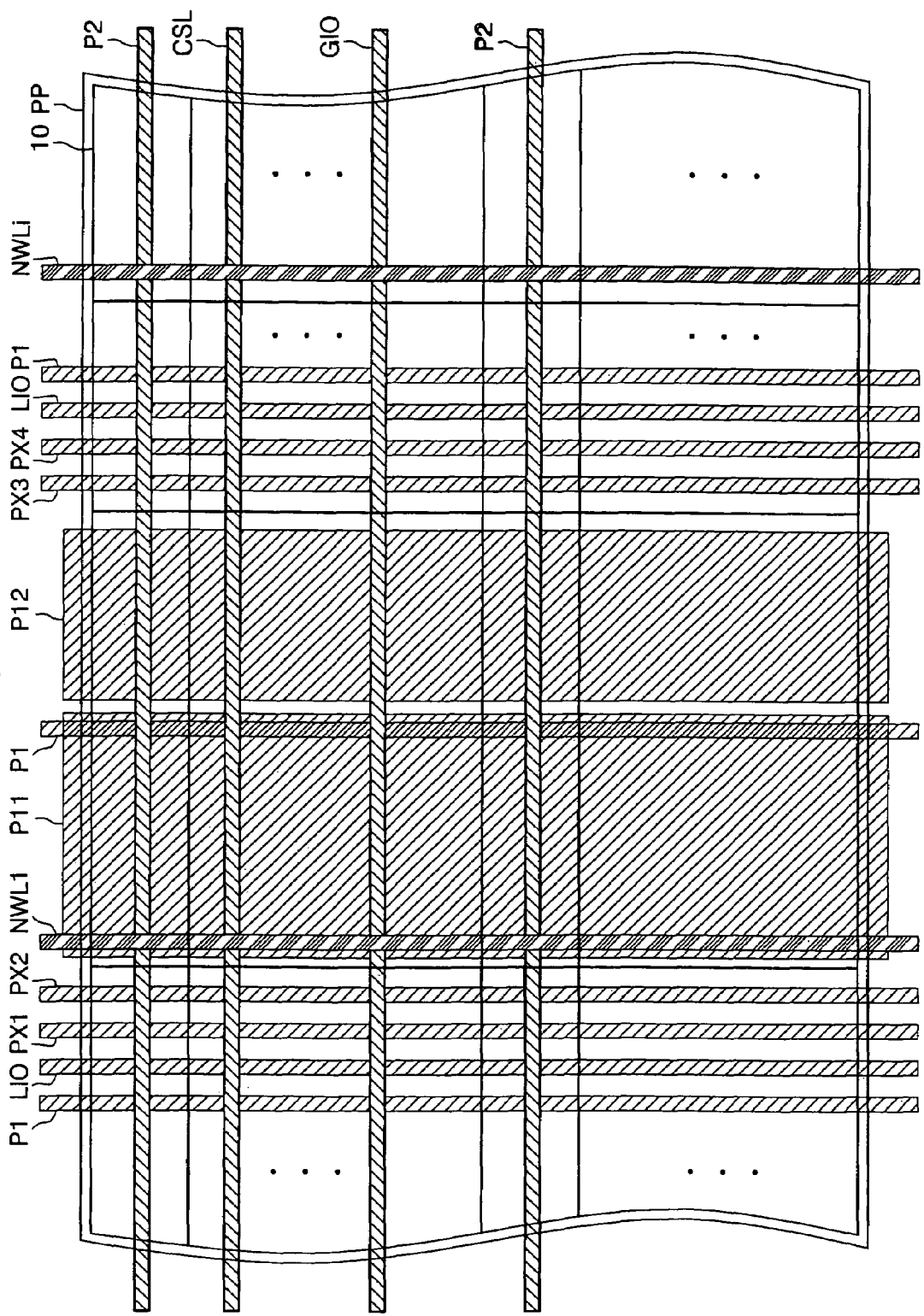

FIGS. 7A and 7B illustrate signal line arrangements of semiconductor memory devices according to fourth embodiments of the present invention. FIG. 7A illustrates signal line arrangements wherein word selecting signal lines PX1 to PX4 and main word lines NWL1 to NWLi are arranged on a third layer other than a first layer, and two power lines P11 and P12 are additionally arranged respectively on left and right sides, i.e., vertically, to cover the whole empty region of a first layer above the sub word line driver region SWD and the sub memory cell array region SMCA. FIG. 7B illustrates signal line arrangements in which the main word lines NWL1 to NWLi are arranged on a third layer other than a first layer (with the word selecting signal lines being arranged on a first layer) and the two power lines P11 and P12 are arranged like that of FIG. 7A. In FIGS. 7A and 7B, the two power lines P11 and P12 may be arranged in the form of wide plates. FIGS. 7A and 7B illustrate arrangements of two power lines P11 and P12, but two or more power lines P11 and P12 may be arranged. Electrical and/or logical functionalities of lines and/or electrodes of FIGS. 7A and 7B may be the same as discussed above with respect to FIGS. 1, 2A-2B, and 3A-3B.

In FIG. 7A, a first insulating layer may be formed on plate poly PP, and local data lines LIO and power lines P1, P11, P12 may be formed on the first insulating layer. Accordingly, the first insulating layer may be between the local data lines LIO and plate poly PP, and between power lines P1, P11, and P12 and plate poly PP. A second insulating layer may be formed on the first insulating layer, on local data lines LIO, and on power lines P1, P11, and P12; and column selecting signal lines CSL, global data lines GIO, and power lines P2 may be formed on the second insulating layer. Accordingly, the second insulating layer may be between local data lines LIO and global data lines GIO at intersections thereof; between local data lines LIO and column selecting lines CSL at intersections thereof, between power lines P1, P11, P12 and global data lines GIO at intersections thereof, and between power lines P1, P11, P12 and column selecting lines CSL at intersections thereof. A third insulating layer may be formed on the second insulating layer, on column selecting signal lines CSL, on global data lines GIO, and on power lines P2; and word selecting signal lines PX1 to PX4 and main word lines NWL1 to NWLi may be formed on the third insulating layer. Accordingly, the third insulating layer may be between column selecting signal lines CSL and word selecting signal lines PX1 to PX4 at intersections thereof; between column selecting signal lines CSL and main word lines NWL1 to NWLi at intersections thereof; between global data lines GIO and word selecting signal lines PX1 to PX4 at intersections thereof; and between global data lines GIO and main word lines NWL1 to NWLi at intersections thereof.

Accordingly, at intersections of word selecting signal lines PX1 to PX4 and column selecting signal lines CSL, the column selecting signal line is between the word selecting signal line and plate poly PP. At intersections of the main word lines NWL1 to NWLi and column selecting signal lines CSL, the column selecting signal line is between the main word line and plate poly PP. At intersections of word selecting signal lines PX1 to PX4 and global data lines GIO, the global data line is between the word selecting signal line and plate poly PP. At intersections of the main word lines NWL1 to NWLi and global data lines GIO, the global data line is between the main word line and plate poly PP.

In FIG. 7B, a first insulating layer may be formed on plate poly PP, and local data lines LIO, power lines P1, P11, P12, and word selecting signal lines PX1 to PX4 may be formed on the first insulating layer. Accordingly, the first insulating layer may be between local data lines LIO and plate poly PP; between power lines P1, P11, P12 and the plate poly PP, and between word selecting signal lines PX1 to PX4 and plate poly PP. A second insulating layer may be formed on the first insulating layer, on local data lines LIO, on power lines P1, P11, P12, and on word selecting signal lines PX1 to PX4; and column selecting signal lines CSL, global data lines GIO, and power lines P2 may be formed on the second insulating layer. Accordingly, the second insulating layer may be between local data lines LIO and global data lines GIO at intersections thereof; between local data lines LIO and column selecting lines CSL at intersections thereof; between power lines P1, P11, P12 and global data lines GIO at intersections thereof; between power lines P1, P11, P12 and column selecting lines CSL at intersections thereof, between word selecting signal lines PX1 to PX4 and global data lines at intersections thereof; and between word selecting signal lines PX1 to PX4 and column selecting lines CSL at intersections thereof. A third insulating layer may be formed on the second insulating layer, on column selecting signal lines CSL, on global data lines GIO, and on power lines P2; and main word lines NWL1 to NWLi may be formed on the third insulating layer. Accordingly, the third insulating layer may be between column selecting signal lines CSL and main word lines NWL1 to NWLi at intersections thereof; between global data lines GIO and main word lines NWL1 to NWLi at intersections thereof; and between power lines P2 and main word lines NWL1 to NWLi at intersections thereof.

Accordingly, at intersections of word selecting signal lines PX1 to PX4 and column selecting signal lines CSL, the word selecting signal line is between the column selecting signal line and plate poly PP. At intersections of main word lines NWL1 to NWLi and column selecting signal lines CSL, the column selecting signal line is between the main word line and the plate poly PP. At intersections of word selecting signal lines PX1 to PX4 and global data lines GIO, the word line selecting signal line is between the global data line and plate poly PP. At intersections of main word lines NWL1 to NWLi and global data line GIO, the global data line is between the main word line and plate poly PP.

Figure 8A:
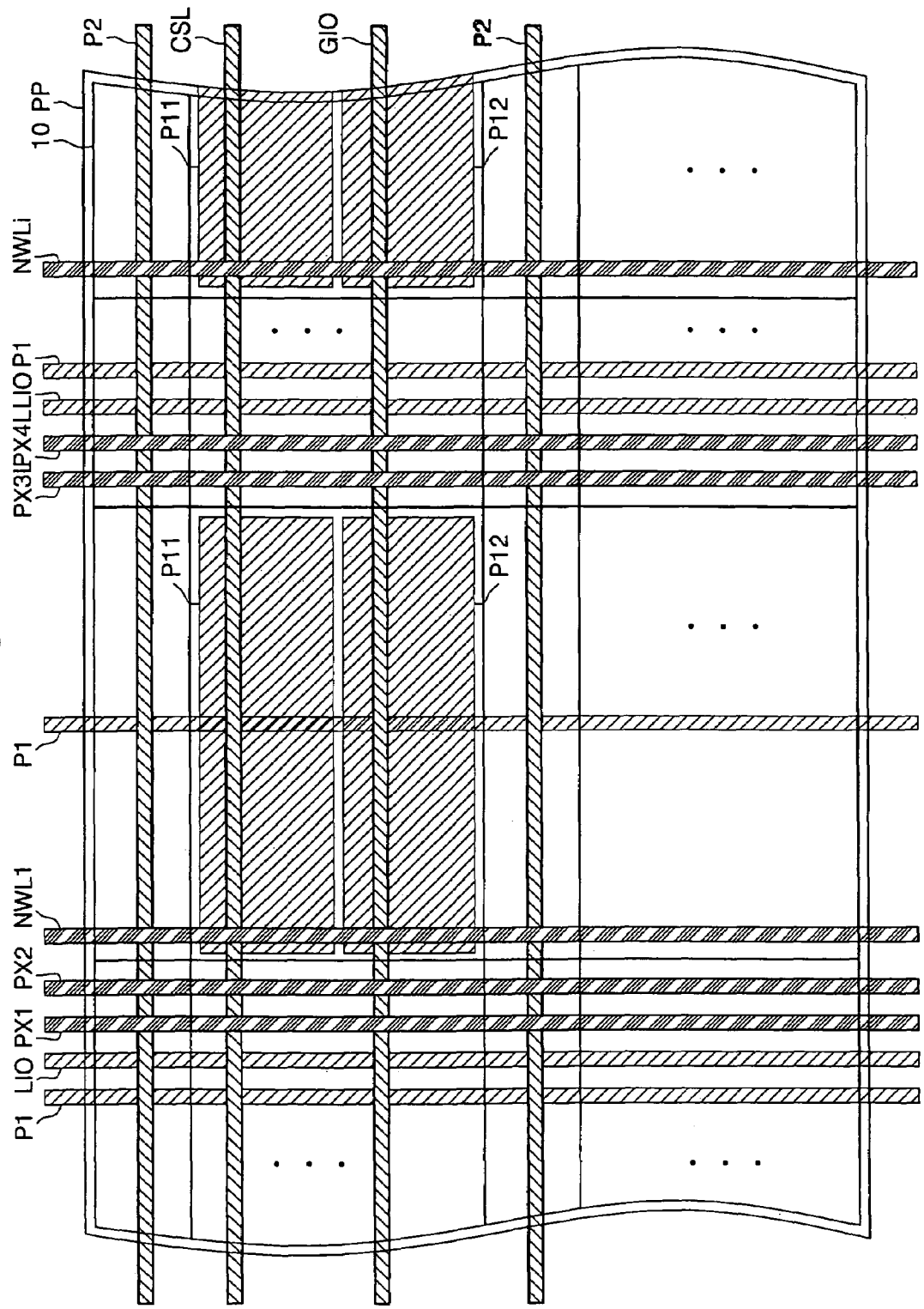

FIGS. 8A and 8B illustrate signal line arrangements of semiconductor memory devices according to fifth embodiments of the present invention. FIG. 8A illustrates a signal line arrangement wherein the word selecting signal lines PX1 to PX4 and the main word lines NWL1 to NWLi are arranged on a third layer other than a first layer, and two power lines P11 and P12 are additionally arranged respectively on upper and lower sides, i.e., horizontally, to cover a whole empty region of a first layer above the sub memory cell array region SMCA. FIG. 8B illustrates signal line arrangements wherein the main word lines NWL1 to NWLi are arranged on a third layer other than a first layer (with the word selecting lines being arranged on a first layer) and the two power lines P11 and P12 are arranged like that of FIG. 8a.

FIGS. 8A and 8B illustrates the two power lines P11 and P12 arranged on upper and lower sides to cover the whole empty region of a first layer above the sub memory cell array region SMCA, but the two power lines P11 and P12 may be arranged to cover the whole empty region of a first layer above the sub word line driver region SWD and the sub memory cell array region SMCA. Electrical and/or logical functionalities of lines and/or electrodes of FIGS. 8A and 8B may be the same as discussed above with respect to FIGS. 1, 2A-2B, and 3A-3B.

In FIG. 8A, a first insulating layer may be formed on plate poly PP, and local data lines LIO and power lines P1, P11, P12 may be formed on the first insulating layer. Accordingly, the first insulating layer may be between the local data lines LIO and plate poly PP, and between power lines P1, P11, and P12 and plate poly PP. A second insulating layer may be formed on the first insulating layer, on local data lines LIO, and on power lines P1, P11, and P12, and column selecting signal lines CSL, global data lines GIO, and power lines P2 may be formed on the second insulating layer. Accordingly, the second insulating layer may be between local data lines LIO and global data lines GIO at intersections thereof; between local data lines LIO and column selecting lines CSL at intersections thereof; between power lines P1, P11, P12 and global data lines GIO at intersections thereof; and between power lines P1, P11, P12 and column selecting lines CSL at intersections thereof. A third insulating layer may be formed on the second insulating layer, on column selecting signal lines CSL, on global data lines GIO, and on the power lines P2; and word selecting signal lines PX1 to PX4 and main word lines NWL1 to NWLi may be formed on the third insulating layer. Accordingly, the third insulating layer may be between column selecting signal lines CSL and word selecting signal lines PX1 to PX4 at intersections thereof; between column selecting signal lines CSL and main word lines NWL1 to NWLi at intersections thereof; between global data lines GIO and word selecting signal lines PX1 to PX4 at intersections thereof; and between global data lines GIO and main word lines NWL1 to NWLi at intersections thereof.

Accordingly, at intersections of word selecting signal lines PX1 to PX4 and column selecting signal lines CSL, the column selecting signal line is between the word selecting signal line and plate poly PP. At intersections of the main word lines NWL1 to NWLi and column selecting signal lines CSL, the column selecting signal line is between the main word line and plate poly PP. At intersections of word selecting signal lines PX1 to PX4 and global data lines GIO, the global data line is between the word selecting signal line and plate poly PP. At intersections of the main word lines NWL1 to NWLi and global data lines GIO, the global data line is between the main word line and plate poly PP.

In FIG. 8B, a first insulating layer may be formed on plate poly PP, and local data lines LIO, power lines P1, P11, P12, and word selecting signal lines PX1 to PX4 may be formed on the first insulating layer. Accordingly, the first insulating layer may be between local data lines LIO and plate poly PP; between power lines P1, P11, P12 and the plate poly PP; and between word selecting signal lines PX1 to PX4 and plate poly PP. A second insulating layer may be formed on the first insulating layer, on local data lines LIO, on power lines P1, P11, P12, and on word selecting signal lines PX1 to PX4; and column selecting signal lines CSL, global data lines GIO, and power lines P2 may be formed on the second insulating layer. Accordingly, the second insulating layer may be between local data lines LIO and global data lines GIO at intersections thereof; between local data lines LIO and column selecting lines CSL at intersections thereof; between power lines P1, P11, P12 and global data lines GIO at intersections thereof; between power lines P1, P11, P12 and column selecting lines CSL at intersections thereof; between word selecting signal lines PX1 to PX4 and global data lines at intersections thereof; and between word selecting signal lines PX1 to PX4 and column selecting lines CSL at intersections thereof. A third insulating layer may be formed on the second insulating layer, on column selecting signal lines CSL, on global data lines GIO, and on power lines P2; and main word lines NWL1 to NWLi may be formed on the third insulating layer. Accordingly, the third insulating layer may be between column selecting signal lines CSL and main word lines NWL1 to NWLi at intersections thereof; between global data lines GIO and main word lines NWL1 to NWLi at intersections thereof; and between power lines P2 and main word lines NWL1 to NWLi at intersections thereof.

Accordingly, at intersections of word selecting signal lines PX1 to PX4 and column selecting signal lines CSL, the word selecting signal line is between the column selecting signal line and plate poly PP. At intersections of main-word lines NWL1 to NWLi and column selecting signal lines CSL, the column selecting signal line is between the main word line and the plate poly PP. At intersections of word selecting signal lines PX1 to PX4 and global data lines GIO, the word line selecting signal line is between the global data line and plate poly PP. At intersections of main word lines NWL1 to NWLi and global data line GIO, the global data line is between the main word line and plate poly PP.

Like semiconductor memory devices of first and second embodiments illustrated in FIGS. 4A-B and 5A-B, semiconductor memory devices of FIGS. 6A-B, 7A-B and/or 8A-B may reduce a voltage drop of the plate poly PP, and may also supply relatively stable power by adding the power lines P1 to make contact between lines which transmit power of the same level among the power lines P1 arranged on a first layer and the power lines P2 arranged on a second layer.

The semiconductor memory devices of FIGS. 6A-6B, 7A-7B and/or 8A-8B may provide an advantage in that the power lines P1, P11 and P12 can be additionally arranged and thus relatively stable power can be supplied, but since the power lines P1, P11 and/or P12 are arranged close to the plate poly PP, leakage current may occur between the plate poly PP and the power lines P1, P11 and/or P12, thereby causing a voltage drop of the plate poly PP.

For the foregoing reason, in order to reduce a drop of voltage level applied to the plate poly PP, semiconductor memory devices of FIGS. 6A-6B may arrange equally in number the power lines P1 to which the cell array power voltage is applied and the power lines P1 to which a ground voltage is applied, and semiconductor memory devices of FIGS. 7A-7B and/or 8A-8B may arrange equally in area the power line P11 to which a power voltage is applied and the power line P12 to which a ground voltage is applied.

By arranging the signal lines as described above, semiconductor memory devices according to embodiments of the present invention may reduce a voltage drop of the plate poly even though there may be a possibility that leakage current occurs due to the added power lines.

The above described embodiments have shown that the word selecting signal lines and the main word lines may be arranged on a third layer and the column selecting signal lines and the global data line pairs may be arranged on a second layer. According to other embodiments, the word selecting signal lines may be arranged on a second layer, and the column selecting signal lines and the global data line pairs may be arranged on a third layer.

The above described embodiments have further shown that the semiconductor memory device may have a sub word line structure. Embodiments of the present invention may also be applied to semiconductor memory devices having no sub word line structure.

As described herein before, semiconductor memory devices and signal line arrangement methods according to embodiments of the present invention may reduce leakage currents which may flow from the plate poly to the word selecting signal lines and the main word lines, thereby reducing a drop of voltage applied to the plate poly. More reliable operations of the semiconductor memory device may thus be provided according to embodiments of the present invention.

Also, semiconductor memory devices and signal line arrangement methods according to embodiments of the present invention may additionally arrange the power lines to thereby supply relatively stable power.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A semiconductor memory device, comprising:
   a memory cell array including a sub memory cell array connected between sub word lines and bit line pairs and having memory cells which are selected in response to signals transmitted to the sub word lines and column selecting signal lines, a bit line sense amplifier configured to sense and amplify data of the bit line pairs, and a sub word line driver configured to combine signals transmitted from word selecting signal lines and signals transmitted from main word lines to select the sub word lines, wherein the memory cell array is configured to transmit data between the bit line pairs and local data line pairs and to transmit data between the local data line pairs and global data line pairs; and
   an electrode on the memory cell array and configured to apply a voltage for the memory cells, wherein the local data line pairs, the word selecting signal lines, and the main word lines are arranged in a same direction as the sub word lines, wherein the column selecting signal lines and the global data line pairs are arranged in a same direction as the bit line pairs, and wherein at least one of the column selecting signal lines and/or at least one of the global data lines is between at least one of the word selecting signal lines and the electrode at an intersection of at least one of the word selecting signal lines and at least one of the column selecting signal lines and/or at least one of the global data lines.

2. A semiconductor memory device according to claim 1 wherein the electrode comprises a plate electrode.

3. A semiconductor memory device according to claim 1 wherein local data lines of the local data line pairs are between global data lines of the global data line pairs and the electrode at intersections thereog and/or wherein local data lines of the local data line pairs are between column selecting lines and the electrode at intersections thereof.

4. A semiconductor memory device according to claim 3 further comprising:
   a first insulating layer between at least one of the local data lines of the local data line pairs and the electrode;
   a second insulating layer on the first insulating layer wherein the second insulating layer is between at least one of the local data lines of the local data line pairs and at least one of the global data lines of the global data line pairs at an intersection thereof, and/or wherein the second insulating layer is between at least one of the local data lines of the local data line pairs and at least one of the column selecting lines at an intersection thereof; and
   a third insulating layer on the second insulating layer wherein the third insulating layer is between at least one of the word selecting signal lines and at least one of the column selecting signal lines at an intersection thereof, and/or wherein the third insulating layer is between at least one of the word selecting signal lines and at least one of the global data lines at an intersection thereof.

5. A semiconductor memory device according to claim 1 wherein at least one of the column selecting signal lines and/or at least one of the global data lines is between at least one of the main word lines and the electrode at an intersection thereof.

6. A semiconductor memory device according to claim 1 wherein a ground voltage or less is applied if the word selecting signal lines and the main word lines are not selected.

7. A semiconductor memory device according to claim 1 further comprising:
- first power lines arranged in a same direction as the word selecting signal lines wherein at least one of the first power lines is between the electrode and at least one of the global data lines and/or the colunm selecting signal lines at an intersection thereof; and
- second power lines arranged in a same direction as the column selecting signal lines wherein at least one of the second power lines is between at least one of the word selecting signal lines and the electrode at an intersection thereof.

8. A semiconductor memory device according to claim 7 wherein at least one of the first power lines is configured to cross a region including the bit line sense amplifier.

9. A semiconductor memory device according to claim 8 wherein the at least one of the first power lines is further configured to cross a region including the sub memory cell array.

10. A semiconductor memory device according to claim 9 wherein the at least one of the first power lines includes a conductive plate covering the region including the sub memory cell array.

11. A semiconductor memory device according to claim 7 wherein the first power lines include a first conductive plate crossing a region including the bit line sense amplifier and a second conductive plate crossing a region including the sub memory cell array, and wherein substantially uniform leakage currents flow between the electrode and each of the first and second conductive plates.

12. A semiconductor memory device according to claim 11 wherein a first voltage is applied to the first conductive plate, wherein a second voltage is applied to the second conductive plate, wherein a third voltage is applied to the electrode, wherein one of the first and second voltages is less than the third voltage, and wherein the other of the first and second voltages is greater than the third voltage.

13. A semiconductor memory device, comprising:
- a memory cell array including a sub memory cell array connected between sub word lines and bit line pairs and having memory cells which are selected in response to signals transmitted to the sub word lines and colunm selecting signal lines, a bit line sense amplifier configured to sense and amplify data of the bit line pairs, and a sub word line driver configured to combine signals transmitted from word selecting signal lines and signals transmitted from main word lines to select the sub word lines, wherein the memory cell array is configured to transmit data between the bit line pairs and local data line pairs and to transmit data between the local data line pairs and global data line pairs; and
- an electrode on the memory cell array and configured to apply a voltage for the memory cells, wherein the local data line pairs, the word selecting signal lines, and the main word lines are arranged in a same direction as the sub word lines, wherein the column selecting signal lines and the global data line pairs are arranged in a same direction as the bit line pairs, and wherein at least one of the colunm selecting signal lines and/or at least one of the global data lines is between at least one of the main word lines and the electrode at an intersection of at least one of the main word lines and at least one of the column selecting signal lines and/or at least one of the global data lines.

14. A semiconductor memory device according to claim 13 wherein the electrode comprises a plate electrode.

15. A semiconductor memory device according to claim 13 wherein local data lines of the local data line pairs are between global data lines of the global data line pairs and the electrode at intersections thereof, and/or wherein local data lines of the local data line pairs are between column selecting lines and the electrode at intersections thereof.

16. A semiconductor memory device according to claim 15 further comprising:
- a first insulating layer between at least one of the local data lines of the local data line pairs and the electrode;
- a second insulating layer on the first insulating layer wherein the second insulating layer is between at least one of the local data lines of the local data line pairs and at least one of the global data lines of the global data line pairs at an intersection thereof; and/or wherein the second insulating layer is between at least one of the local data lines of the local data line pairs and at least one of the colunm selecting lines at an intersection thereof; and
- a third insulating layer on the second insulating layer wherein the third insulating layer is between at least one of the main word lines and at least one of the column selecting signal lines at an intersection thereof, and/or wherein the third insulating layer is between at least one of the main word lines and at least one of the global data lines at an intersection thereof.

17. A semiconductor memory device according to claim 13 wherein at least one of the column selecting signal lines and/or at least one of the global data lines is between at least one of the word selecting signal lines and the electrode at an intersection thereof.

18. A semiconductor memory device according to claim 13 wherein a ground voltage or less is applied if the word selecting signal lines and the main word lines are not selected.

19. A semiconductor memory device according to claim 13 further comprising:
- first power lines arranged in a same direction as the word selecting signal lines wherein at least one of the first power lines is between the electrode and at least one of the global data lines and/or the column selecting signal lines at an intersection thereof; and
- second power lines arranged in a same direction as the column selecting signal lines wherein at least one of the second power lines is between at least one of the main word lines and the electrode at an intersection thereof.

20. A semiconductor memory device according to claim 19 wherein at least one of the first power lines is configured to cross a region including the bit line sense amplifier.

21. A semiconductor memory device according to claim 20 wherein the at least one of the first power lines is further configured to cross a region including the sub memory cell array.

22. A semiconductor memory device according to claim 21 wherein the at least one of the first power lines includes a conductive plate covering the region including the sub memory cell array.

23. A semiconductor memory device according to claim 19 wherein the first power lines include a first conductive plate crossing a region including the bit line sense amplifier and a second conductive plate crossing a region including the sub memory cell array, and wherein substantially uniform leakage currents flow between the electrode and each of the first and second conductive plates.

24. A semiconductor memory device according to claim 23 wherein a first voltage is applied to the first conductive plate, wherein a second voltage is applied to the second conductive plate, wherein a third voltage is applied to the electrode, wherein one of the first and second voltages is less than the third voltage, and wherein the other of the first and second voltages is greater than the third voltage.

25. A semiconductor memory device according to claim 2 wherein the plate electrode comprises a polysilicon plate electrode.

26. A semiconductor memory device according to claim 1 wherein one of the column selecting signal lines is between one of the word selecting signal lines and the electrode at an intersection of the word selecting signal line and the column selecting signal line.

27. A semiconductor memory device according to claim 1 wherein one of the global data lines is between one of the word selecting signal lines and the electrode at an intersection of the word selecting signal line and the global data line.

28. A semiconductor memory device according to claim 14 wherein the plate electrode comprises a polysilicon plate electrode.

29. A semiconductor memory device according to claim 13
wherein one of the column selecting signal lines is between one of the main word lines and the electrode at an intersection of the main word line and the column selecting signal line.

30. A semiconductor memory device according to claim 13
wherein one of the global data lines is between one of the main word lines and the electrode at an intersection of the main word line and the global data line.

* * * * *